US010566289B2

(12) United States Patent
Lee et al.

(10) Patent No.: US 10,566,289 B2
(45) Date of Patent: Feb. 18, 2020

(54) FAN-OUT SEMICONDUCTOR PACKAGE AND MANUFACTURING METHOD THEREOF

(71) Applicant: SAMSUNG ELECTRONICS CO., LTD., Suwon-si (KR)

(72) Inventors: Doo Hwan Lee, Suwon-si (KR); Kyung Seob Oh, Suwon-si (KR); Jong Rip Kim, Suwon-si (KR); Hyoung Joon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/286,253

(22) Filed: Oct. 5, 2016

(65) Prior Publication Data
US 2017/0103951 A1 Apr. 13, 2017

(30) Foreign Application Priority Data

Oct. 13, 2015 (KR) .................. 10-2015-0143009
Feb. 24, 2016 (KR) .................. 10-2016-0021767
Aug. 24, 2016 (KR) .................. 10-2016-0107634

(51) Int. Cl.
H01L 23/538 (2006.01)
H01L 23/31 (2006.01)
(Continued)

(52) U.S. Cl.
CPC ...... H01L 23/5389 (2013.01); H01L 21/4857 (2013.01); H01L 21/56 (2013.01);
(Continued)

(58) Field of Classification Search
CPC ............. H01L 23/5389; H01L 23/3121; H01L 23/3128; H01L 23/295; H01L 23/5383;
(Continued)

(56) References Cited

U.S. PATENT DOCUMENTS 6,664,341 B2 * 12/2003 Kitayama ............ C08G 63/065
252/299.01
8,354,304 B2 1/2013 Chow et al.
(Continued)

FOREIGN PATENT DOCUMENTS

JP 2006-59992 A 3/2006
JP 2007-118323 A 5/2007
(Continued)

OTHER PUBLICATIONS

Japanese Office Action issued in corresponding Japanese Patent Application No. 2016-200166, dated Jun. 5, 2018, with English Translation.
Japanese Office Action dated Feb. 5, 2019 issued in Japanese Patent Application No. 2016-200166 (with English translation).
Office Action issued in corresponding Korean Patent Application No. 10-2016-0107634, dated Mar. 11, 2019.

Primary Examiner — Zandra V Smith
Assistant Examiner — Abbigale A Boyle
(74) Attorney, Agent, or Firm — Sughrue Mion, PLLC

(57) ABSTRACT

A fan-out semiconductor package may include: a first connection member having a through hole; a semiconductor chip disposed in the through hole and having an active surface on which a connection pad is disposed and a non-active surface opposing the active surface; an encapsulant at least partially encapsulating the first connection member and the non-active surface of the semiconductor chip; and a second connection member disposed on the first connection member and the active surface of the semiconductor chip and including a redistribution layer electrically connected to the connection pad, wherein the first connection member includes a first insulating layer, a first redistribution layer embedded in the first insulating layer while contacting the second connection member, and a second redistribution layer disposed on the other side of the first insulating layer opposing one side thereof in which the first redistribution layer is embedded.

36 Claims, 27 Drawing Sheets

(51) Int. Cl.
*H01L 21/48* (2006.01)
*H01L 21/56* (2006.01)
*H01L 23/00* (2006.01)
*H01L 21/683* (2006.01)
*H01L 23/29* (2006.01)

(52) U.S. Cl.
CPC ........ *H01L 21/565* (2013.01); *H01L 21/6835* (2013.01); *H01L 23/295* (2013.01); *H01L 23/3121* (2013.01); *H01L 23/3128* (2013.01); *H01L 23/5383* (2013.01); *H01L 23/5384* (2013.01); *H01L 24/19* (2013.01); *H01L 24/20* (2013.01); *H01L 21/568* (2013.01); *H01L 23/3107* (2013.01); *H01L 23/5386* (2013.01); *H01L 2221/68345* (2013.01); *H01L 2221/68359* (2013.01); *H01L 2224/04105* (2013.01); *H01L 2224/12105* (2013.01); *H01L 2224/16227* (2013.01); *H01L 2224/24195* (2013.01); *H01L 2225/1035* (2013.01); *H01L 2225/1041* (2013.01); *H01L 2225/1058* (2013.01); *H01L 2924/15311* (2013.01); *H01L 2924/18162* (2013.01); *H01L 2924/19041* (2013.01); *H01L 2924/19105* (2013.01); *H01L 2924/19106* (2013.01); *H01L 2924/3025* (2013.01)

(58) Field of Classification Search
CPC ............. H01L 23/5384; H01L 21/4857; H01L 21/565
See application file for complete search history.

(56) References Cited

U.S. PATENT DOCUMENTS

| | | | |
|---|---|---|---|
| 8,850,701 | B2* | 10/2014 | Cai ........................ H05K 1/183 156/250 |
| 2006/0040463 | A1 | 2/2006 | Sunohara |
| 2009/0243065 | A1* | 10/2009 | Sugino ................... H01L 23/16 257/686 |
| 2010/0200975 | A1 | 8/2010 | Chino |
| 2011/0024904 | A1 | 2/2011 | Egawa |
| 2012/0013021 | A1* | 1/2012 | Kobayashi ........ H01L 23/49827 257/774 |
| 2013/0249101 | A1* | 9/2013 | Lin ........................ H01L 24/19 257/773 |
| 2013/0328177 | A1 | 12/2013 | Cho et al. |
| 2014/0360765 | A1* | 12/2014 | Kiwanami ............. H05K 1/185 174/260 |
| 2015/0187742 | A1 | 7/2015 | Kwon et al. |

FOREIGN PATENT DOCUMENTS

| | | |
|---|---|---|
| JP | 2010-186847 A | 8/2010 |
| JP | 2011-035056 A | 2/2011 |
| JP | 2012-039090 A | 2/2012 |
| KR | 10-2013-0137482 A | 12/2013 |
| KR | 10-1362715 B1 | 2/2014 |
| KR | 10-2015-0018946 A | 2/2015 |

* cited by examiner

I - I'

II-II'

III-III'

IV-IV'

V-V'

VI-VI'

VII-VII'

US 10,566,289 B2

FAN-OUT SEMICONDUCTOR PACKAGE AND MANUFACTURING METHOD THEREOF

CROSS-REFERENCE TO RELATED APPLICATION(S)

This application claims benefit of priority to Korean Patent Application Nos. 10-2015-0143009 filed on Oct. 13, 2015, 10-2016-0021767 filed on Feb. 24, 2016 and 10-2016-0107634 filed on Aug. 24, 2016 in the Korean Intellectual Property Office, the disclosures of which are incorporated herein by reference in their entirety.

BACKGROUND

1. Field

The present disclosure relates to a semiconductor package, for example, a fan-out semiconductor package in which connection terminals may be extended outwardly of a region in which a semiconductor chip is disposed, and a manufacturing method thereof.

2. Description of Related Art

Recently, a significant trend in the development of technology associated with semiconductor chips is reducing the size of components. Therefore, in the field of package technology, in accordance with an increase in demand for small sized semiconductor chips, or the like, the implementation of a semiconductor package having a compact size while including a plurality of pins has been demanded.

One type of package technology suggested in order to satisfy the technical requirements as described above is a fan-out semiconductor package. Such a fan-out semiconductor package may be useful in terms of the implementation of a large number of pins while having a compact size by redistributing a connection terminal outwardly of a region in which a semiconductor chip is disposed.

SUMMARY

An aspect of the present disclosure may provide a fan-out semiconductor package capable of solving the problem of non-uniformity of an insulating distance of a second connection member generated due to a thickness of a redistribution layer at the time of introducing a first connection member on which the redistribution layer is formed to an encapsulation region of a semiconductor chip, and an efficient manufacturing method thereof.

One solution suggested in the present disclosure is to embed a redistribution layer, contacting a second connection member, in the first connection member.

According to an aspect of the present disclosure, a fan-out semiconductor package may include: a first connection member having a through hole; a semiconductor chip disposed in the through hole of the first connection member and having an active surface on which a connection pad is disposed and a non-active surface opposing the active surface; an encapsulant at least partially encapsulating the first connection member and the non-active surface of the semiconductor chip; and a second connection member disposed on the first connection member and the active surface of the semiconductor chip and including a redistribution layer electrically connected to the connection pad, wherein the first connection member includes a first insulating layer, a first redistribution layer embedded in the first insulating layer while contacting the second connection member, and a second redistribution layer disposed on the other side of the first insulating layer opposing one side thereof in which the first redistribution layer is embedded, the first and second redistribution layers being electrically connected to the connection pad.

According to another aspect of the present disclosure, a manufacturing method of a fan-out semiconductor package may include: preparing a carrier film; forming a first connection member on the carrier film; removing the carrier film; forming a through hole penetrating through the first connection member; disposing a semiconductor chip having an active surface on which a connection pad is disposed and a non-active surface opposing the active surface in the through hole; at least partially encapsulating the first connection member and the non-active surface of the semiconductor chip using an encapsulant; and forming a second connection member including a redistribution layer electrically connected to the connection pad on the first connection member and the active surface of the semiconductor chip, wherein the forming of the first connection member includes forming a first redistribution layer on the carrier film, forming a first insulating layer embedding the first redistribution layer on the carrier film, and forming a second redistribution layer on the other side of the first insulating layer opposing one side thereof in which the first redistribution layer is embedded, the first and second redistribution layers being electrically connected to the connection pad.

According to another aspect of the present disclosure, a fan-out semiconductor package may include: a semiconductor chip having an active surface on which a connection pad is disposed and a non-active surface opposing the active surface; one or more connection units disposed around the semiconductor chip; and a connection member disposed on the connection units and the semiconductor chip, wherein the connection unit includes a first insulating layer, a first redistribution layer embedded in the first insulating layer while contacting the connection member, and a second redistribution layer disposed on the other side of the first insulating layer opposing one side thereof in which the first redistribution layer is embedded, and the connection member includes an insulating layer and a redistribution layer disposed on the insulating layer, the first and second redistribution layers of the connection unit and the redistribution layer of the connection member being electrically connected to the connection pad of the semiconductor chip.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
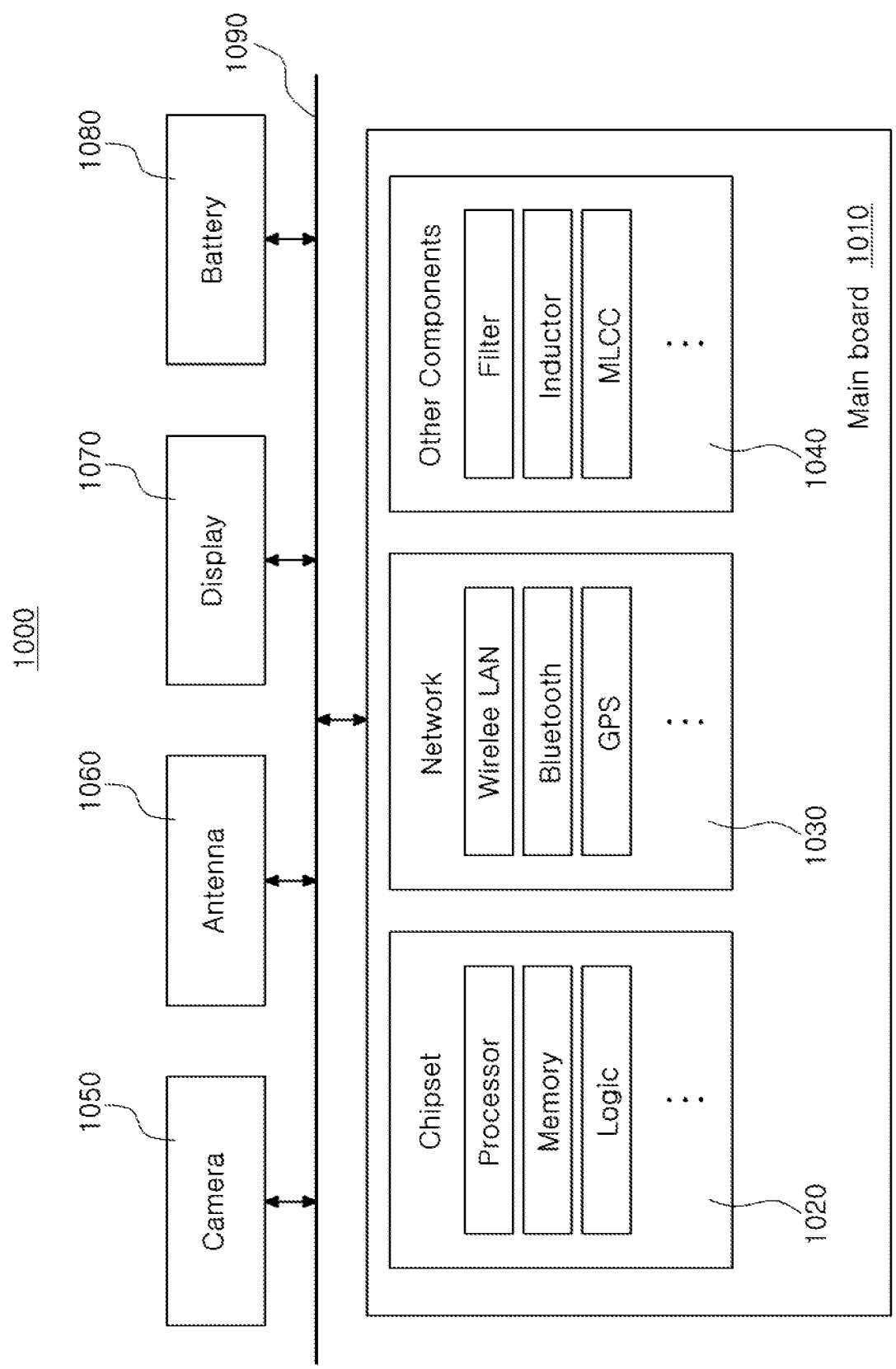
FIG. 1 is a block diagram schematically illustrating an example of an electronic device system.

Hereinafter, the present disclosure will be described with reference to the accompanying drawings. Shapes and sizes of components illustrated in the drawings may be exaggerated or reduced in order to provide more clear description.

The term 'example' or 'modified example' used in the present disclosure does not mean the same exemplary embodiment, but is provided in order emphasize and describe different unique features. However, the above suggested examples or modified examples may also be implemented to be combined with features of other examples or modified examples. For example, even though particulars described in a specific example are not described in another example, it may be understood as a description related to another example unless described otherwise.

In the present disclosure, the term 'connected to' includes that one component is not only directly connected to another component, but is also indirectly connected to another component. Meanwhile, the term 'electrically connected' includes both of a case in which one component is physically connected to another component and a case in which any component is not physically connected to another component. In addition, terms "first", "second", and the like, are used to distinguish one component from another component, and do not limit a sequence, importance, and/or the like, of the corresponding components. In some cases, a first component may be named a second component and a second component may also be similarly named a first component, without departing from the scope of the present disclosure.

In the present disclosure, an upper portion, a lower portion, an upper side, a lower side, an upper surface, a lower surface, and the like, are decided based on the accompanying drawing. For example, a first connection member is positioned to be higher than a redistribution layer. However, the claim is not limited thereto. In addition, a vertical direction refers to the above-mentioned upward and downward directions, and a horizontal direction refers to a direction perpendicular to the above-mentioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

In addition, terms used in the present disclosure are used only in order to describe an example rather than limiting the present disclosure. Here, singular forms include plural forms unless interpreted otherwise in a context.

While exemplary embodiments have been shown and described above, it will be apparent to those skilled in the art that modifications and variations could be made without departing from the scope of the present invention as defined by the appended claims.

Electronic Device

FIG. 1 is a block diagram schematically illustrating an example of an electronic device system.

Referring to FIG. 1, an electronic device 1000 may accommodate a main board 1010 therein. Chip-related components 1020, network-related components 1030, other components 1040, and the like, may be physically and/or electrically connected to the main board 1010. These components may be connected to other components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; a logic chip such as an analog-to-digital (A-D) converter, an application-specific integrated circuit (ASIC), or the like, and the like. However, the chip related components 1020 are not limited thereto, but may also include other types of chip related components. In addition, these components 1020 may be combined with each other.

The network related components 1030 may include protocols such as wireless fidelity (Wi-Fi) (Institute of Electrical and Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols and any other wireless and wired protocols designated after the above-mentioned protocols. However, the network related components 1030 are not limited thereto, but may also include any of a plurality of other wireless or wired standards or protocols. In addition, these components 1030 may be combined with each other, together with the chip-related components 1020.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, but may also include passive components used for various other purposes, and the like. In addition, these components 1040 may be combined with each other, together with the chip-related components 1020 and/or the network-related components 1030.

The electronic device 1000 may include other components that may be or may not be physically and/or electrically connected to the main board 1010 depending on the type of electronic device 1000. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on the kind of electronic device 1000.

The electronic device 1000 may be a smartphone, a personal digital assistant, a digital video camera, a digital still camera, a network system, a computer, a monitor, a tablet, a laptop, a netbook, a television, a video game machine, a smart watch, an automotive component, or the like. However, the electronic device 1000 is not limited thereto, but may also be any other electronic device processing data as well as the above-mentioned electronic devices.

Figure 2:
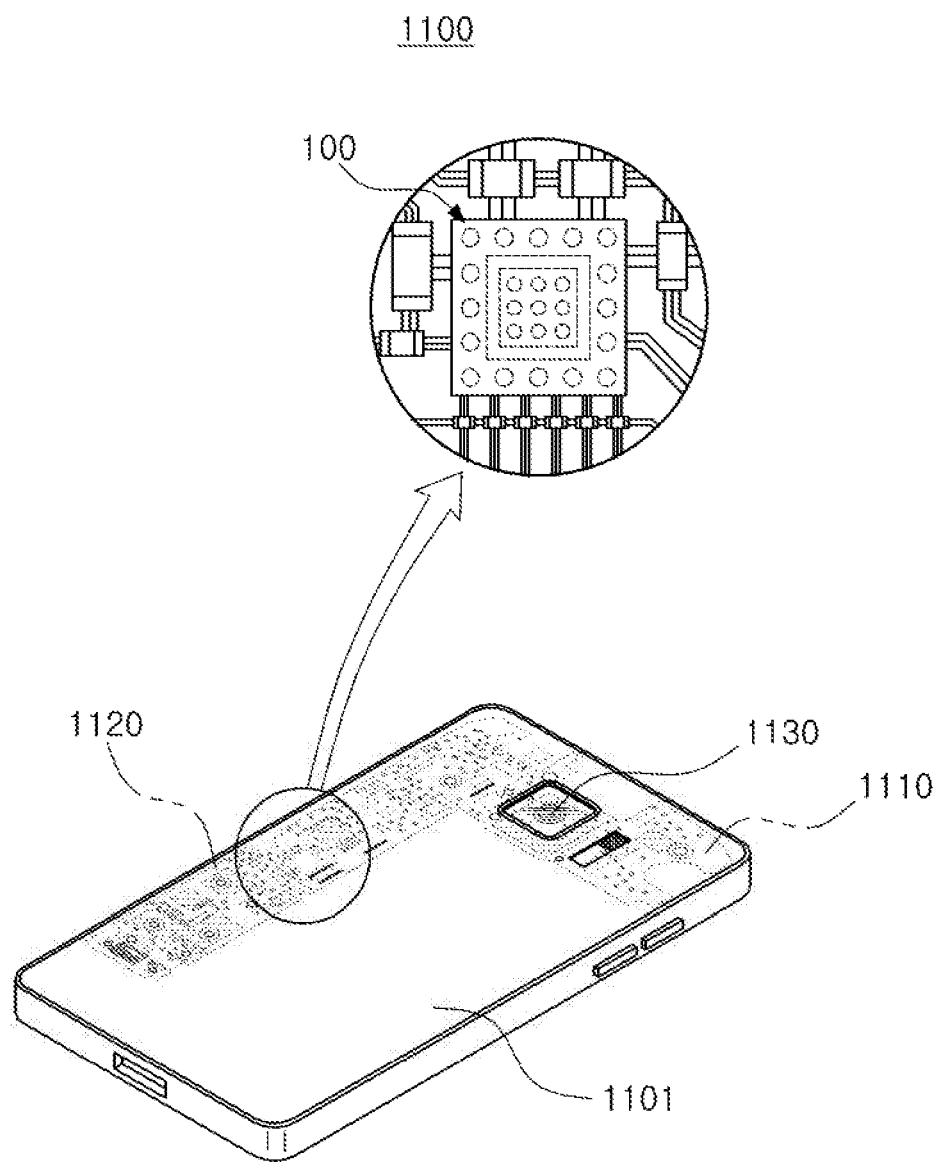
FIG. 2 is a perspective diagram schematically illustrating an example of an electronic device.

FIG. 2 is a perspective diagram schematically illustrating an example of an electronic device.

Referring to FIG. 2, a semiconductor package may be used for various purposes in various electronic devices as described above. For example, a main board 1110 may be accommodated in a body 1101 of a smartphone 1100, and various components 1120 may be physically and/or electrically connected to the main board 1110. Further, another component, for example, a camera 1130, which may or may not be physically and/or electrically connected to the main board 1110, may be accommodated in the body 1101. In this case, some of the components 1120 may be the chip-related components as described above, and the semiconductor package 100 may be, for example, an application processor among the chip-related components, but the component 1120 and the semiconductor package 100 are not limited thereto. The electronic device is not necessarily limited to the smartphone 1100, but may also be another electronic device as described above.

Semiconductor Package

In general, a number of fine electronic circuits are integrated in a single semiconductor chip. However, the semiconductor chip itself may not serve as a completed semiconductor product, and may be damaged by an external physical or chemical impact. Therefore, the semiconductor chip is not used by itself, but is packaged to thereby be used in an electronic device, or the like, in a package state.

Semiconductor packaging is required because there may be a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board of the electronic device are significantly larger than those of the semiconductor chip. Therefore, it may be difficult to directly mount the semiconductor chip on the main board as described above, and a packaging technology capable of buffering the difference in the circuit width between the semiconductor chip and the main board is required.

A semiconductor package manufactured by the packaging technology as described above may be divided into a fan-in semiconductor package and a fan-out semiconductor package depending on a structure and a purpose thereof.

Hereinafter, the fan-in semiconductor package and the fan-out semiconductor package will be described in more detail with reference to the accompanying drawings.

(Fan-in Semiconductor Package)

Figure 3B:
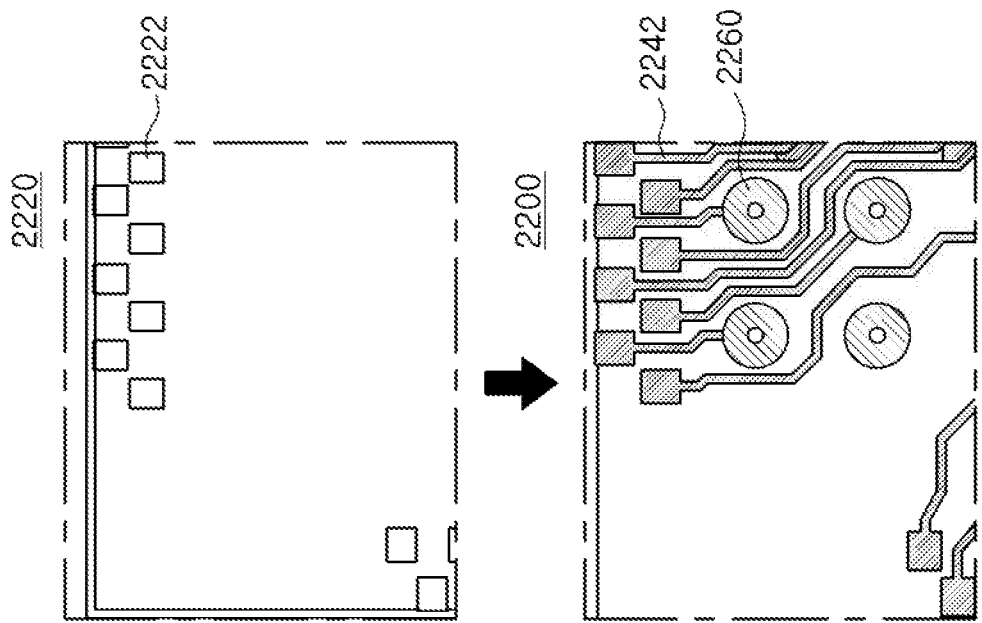
FIGS. 3A and 3B are cross-sectional diagrams schematically illustrating a state of a fan-in semiconductor package before and after being packaged.
Figure 3A:
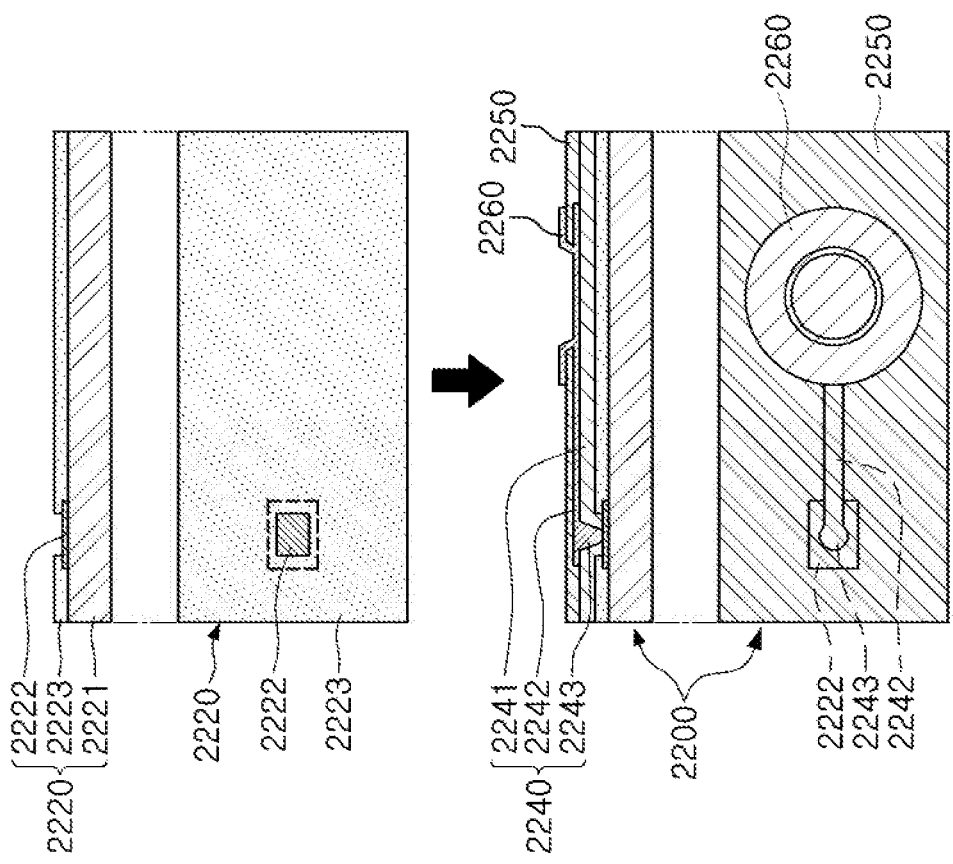

FIGS. 3A and 3B are cross-sectional diagrams schematically illustrating states of a fan-in semiconductor package before and after being packaged.

Figure 4:
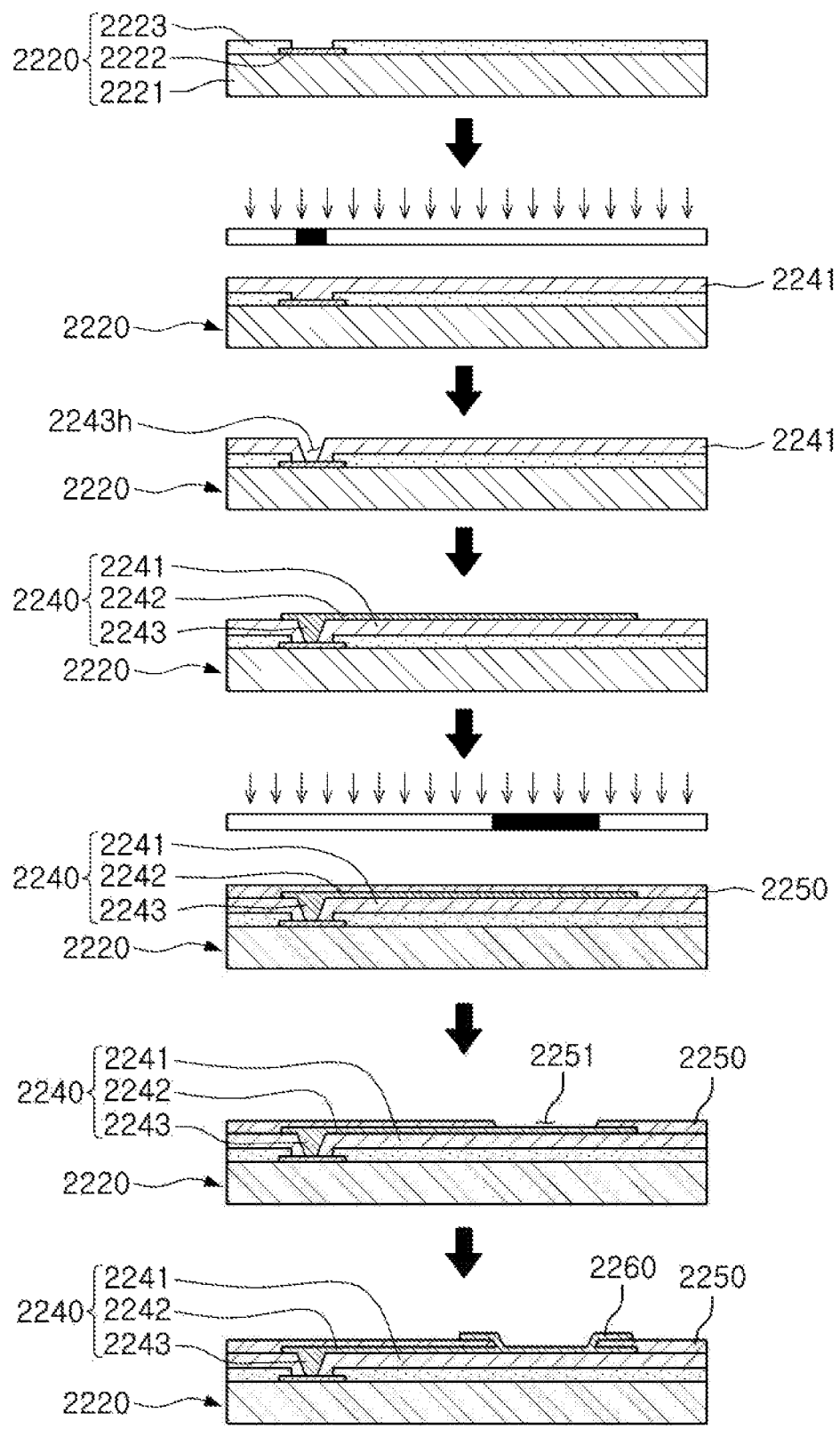
FIG. 4 is a cross-sectional diagram schematically illustrating a packaging process of the fan-in semiconductor package.

FIG. 4 is a cross-sectional diagram schematically illustrating a packaging process of a fan-in semiconductor package.

Referring to FIGS. 3A through 4, a semiconductor chip 2220 may be, for example, an integrated circuit (IC) in a bare state, including a body containing silicon (Si), germanium (Ge), gallium arsenide (GaAs), or the like, connection pads 2222 formed on one surface of the body 2221 and containing a conductive material such as aluminum (Al), or the like, and a passivation film 2223 such as an oxide film, a nitride film, or the like, formed on one surface of the body 2221 and covering at least some of the connection pads 2222. Here, since the connection pads 222 are very small, it is difficult to mount the integrated circuit (IC) on an intermediate level printed circuit board (PCB) as well as the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an under-bump metallization layer 2260, or the like, may be formed. That is, a fan-in semiconductor package 2200 including, for example, the semiconductor chip 2220, the connection member 2240, the passivation layer 2250, and the under-bump metallization layer 2260, may be manufactured through a series of processes.

As described above, the fan-in semiconductor package may have a package form in which all of the connection pads, for example, all input/output (I/O) terminals, of the semiconductor chip are disposed inside the semiconductor chip, and may have excellent electrical characteristics and be produced at a low cost. Therefore, many elements mounted in a smartphone have been manufactured in a fan-in semiconductor package form. In detail, many elements mounted in the smartphone have been developed to implement a rapid signal transfer while having a small size.

However, since all of the I/O terminals need to be disposed inside the semiconductor chip in the fan-in semiconductor chip, the fan-in semiconductor package has a large spatial limitation. Therefore, it may be difficult to apply this structure to a semiconductor chip having a large number of I/O terminals or a semiconductor chip having a small size. Further, due to the disadvantages described above, the fan-in semiconductor package may not be able to be directly mounted and used on the main board of the electronic device. In this regard, even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may be insufficient to directly mount the fan-in semiconductor package on the main board of the electronic device.

Figure 5:
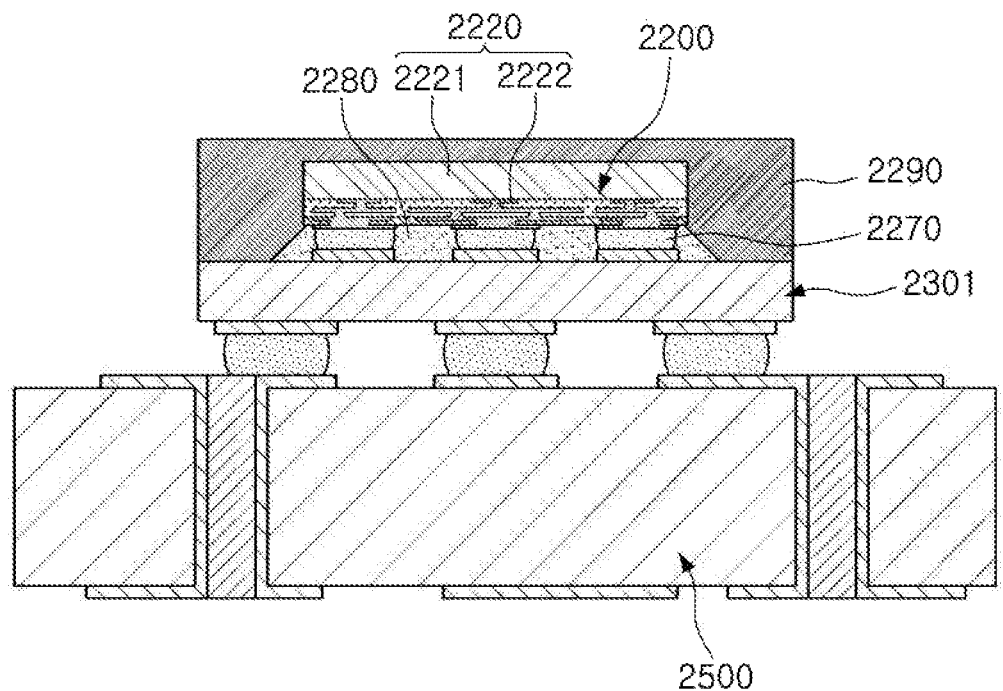
FIG. 5 is a cross-sectional diagram schematically illustrating a case in which a fan-in semiconductor package is mounted on an interposer substrate and is finally mounted on a main board of an electronic device.

FIG. 5 is a cross-sectional diagram schematically illustrating a case in which a fan-in semiconductor package is mounted on an interposer substrate and is finally mounted on a main board of an electronic device.

Figure 6:
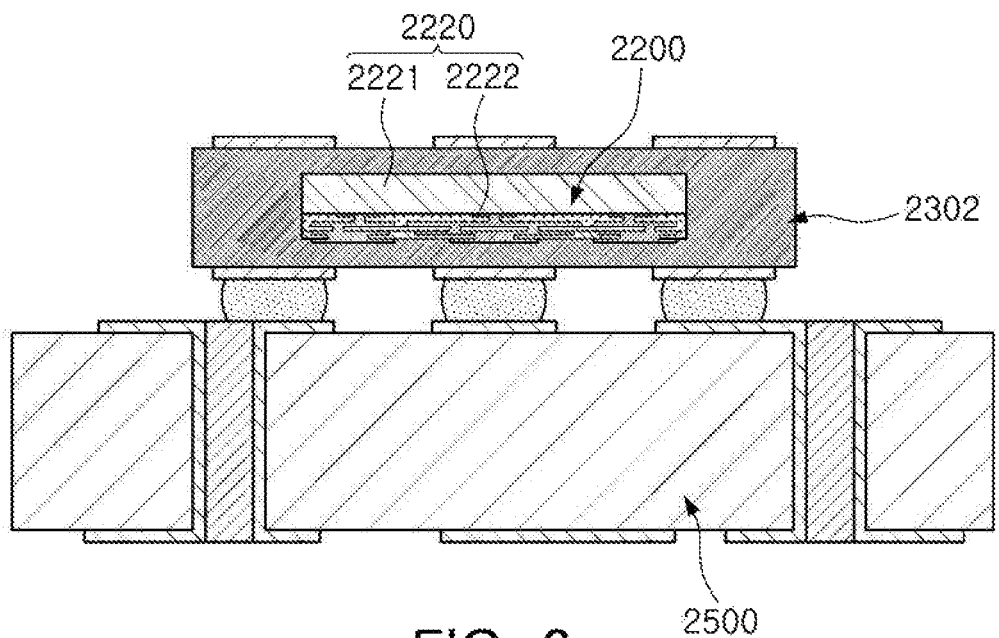
FIG. 6 is a cross-sectional diagram schematically illustrating a case in which a fan-in semiconductor package is embedded in an interposer substrate and is finally mounted on a main board of an electronic device.

FIG. 6 is a cross-sectional diagram schematically illustrating a state in which a fan-in semiconductor package is embedded in an interposer substrate and is finally mounted on a main board of an electronic device.

Referring to FIG. 5, in a fan-in semiconductor package 2200, connection pads 2222, that is, the I/O terminals, of a semiconductor chip 2220 may be redistributed once more through an interposer substrate 2301, and the fan-in semiconductor package 2200 may be finally mounted on a main board 2500 of an electronic device in a state in which it is mounted on the interposer substrate 2301. Here, solder balls 2270, or the like, may be fixed by an underfill resin 2280, or the like, and an outer side of the semiconductor chip may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

(Fan-Out Semiconductor Package)

Figure 7:
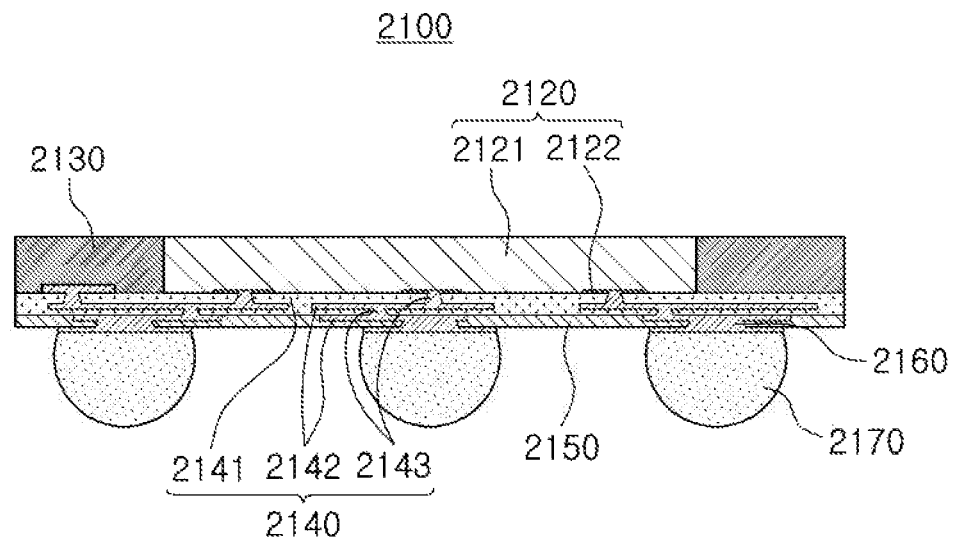
FIG. 7 is a cross-sectional diagram schematically illustrating a fan-out semiconductor package.

FIG. 7 is a cross-sectional diagram schematically illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed up to the outer side of the semiconductor chip 2120 by a connection member 2140. Here, a passivation layer 2150 may be further formed on the connection member 2140, and under-bump metallization layers 2160 may be further formed in openings of the passivation layer 2150. Solder balls 2170 may be further formed on the under-bump metallization layers 2160. The semiconductor chip 2120 may be an integrated circuit (IC) including a body 2121, the connection pads 2122, a passivation film (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed up to the outer side of the semiconductor chip through the connection member formed on the semiconductor chip. As described above, in the fan-in semiconductor package, all of the I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed up to the outer side of the semiconductor chip through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
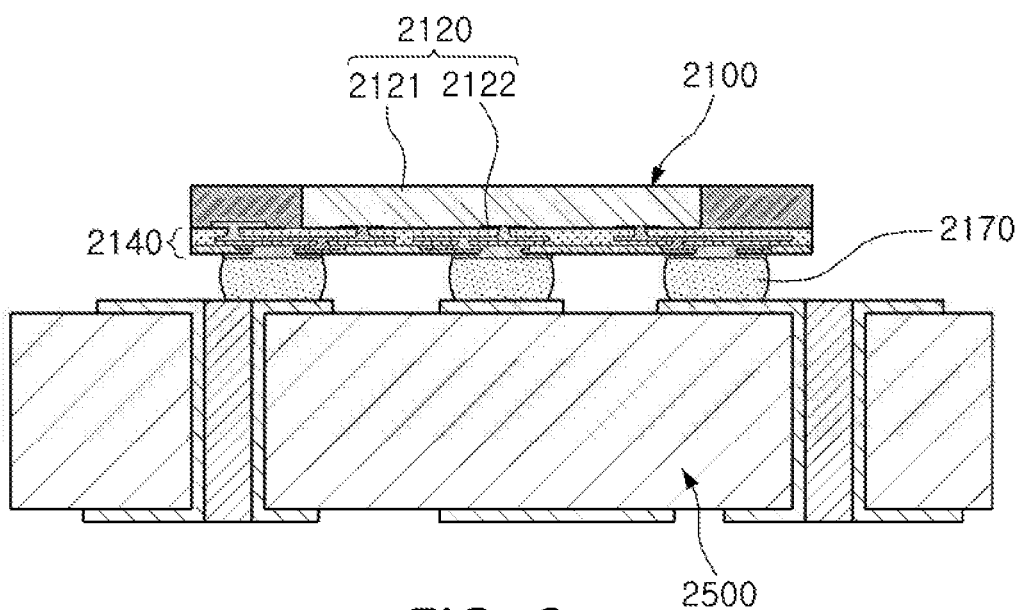
FIG. 8 is a cross-sectional diagram schematically illustrating a state in which a fan-out semiconductor package is mounted on a main board of an electronic device.

FIG. 8 is a cross-sectional diagram schematically illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 up to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness thinner than that of the fan-in semiconductor package using the interposer substrate. Therefore, the fan-out semiconductor package may be miniaturized and thinned. In addition, the fan-out semiconductor package has excellent thermal characteristics and electrical characteristics, such that the fan-out semiconductor package may be particularly appropriate for a mobile product. Further, the fan-out semiconductor package may be implemented in a form more compact than that of a general package-on-package type using a printed circuit board (PCB), and may solve a problem due to occurrence of a warpage phenomenon.

Meanwhile, the fan-out semiconductor package refers to a package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and in which the fan-in semiconductor package is embedded.

Hereinafter, a fan-out semiconductor package capable of solving the problem of non-uniformity of an insulating distance of a second connection member generated due to a thickness of a redistribution layer at the time of introducing a first connection member on which the redistribution layer is formed to an encapsulation region of a semiconductor chip will be described with reference to the accompanying drawings.

Figure 9:
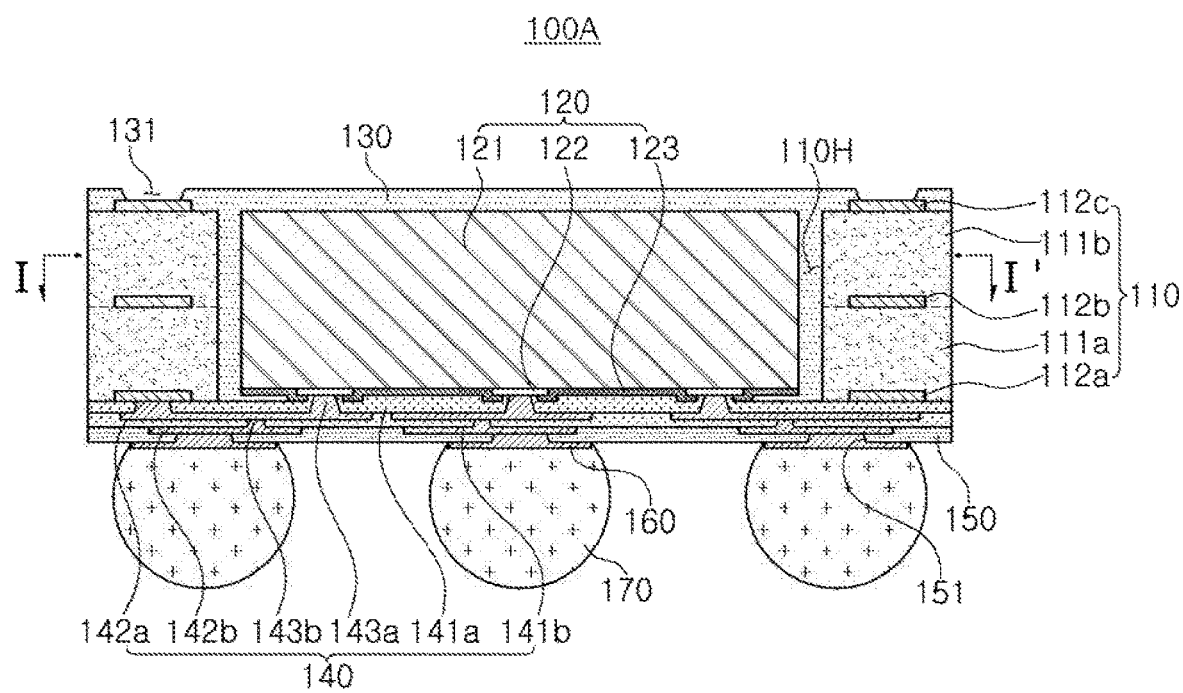
FIG. 9 is a cross-sectional diagram schematically illustrating an example of the fan-out semiconductor package.

FIG. 9 is a cross-sectional diagram schematically illustrating an example of the fan-out semiconductor package.

Figure 10:
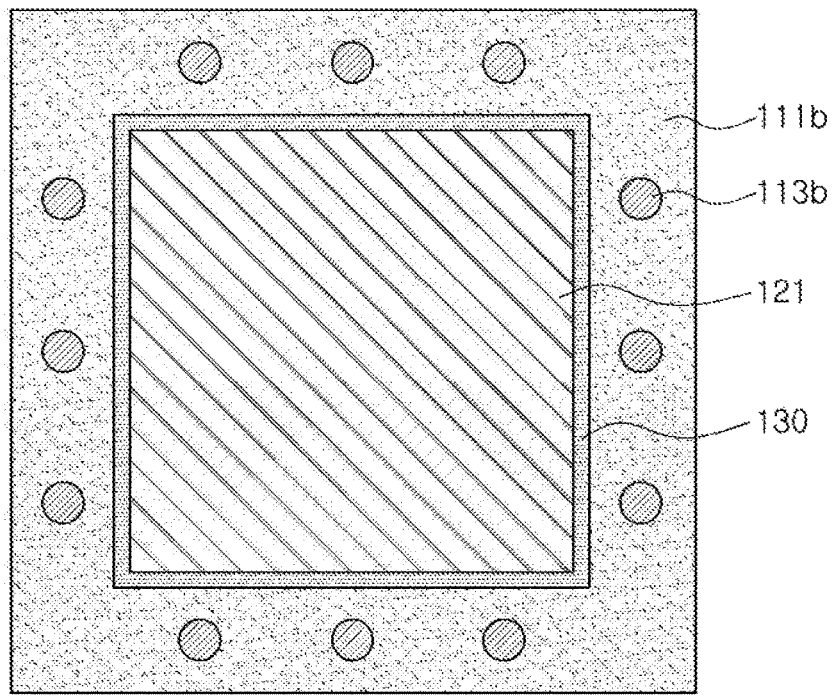
FIG. 10 is a cut-away plan diagram of the fan-out semiconductor package taken along line I-I' of FIG. 9.
Figure 11A:
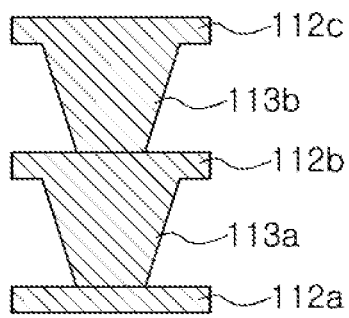
FIGS. 11A through 11D are cross-sectional diagrams schematically illustrating various shapes of a via formed in a first connection member of the fan-out semiconductor package of FIG. 9.
Figure 11B:
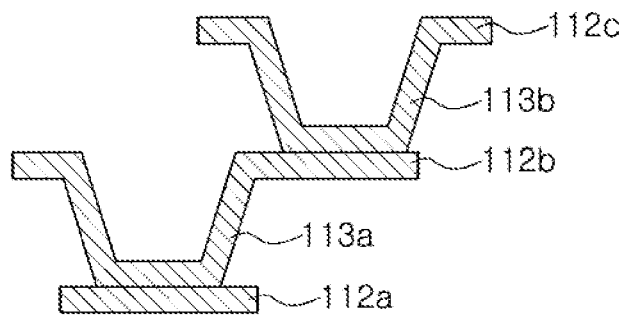
Figure 11C:
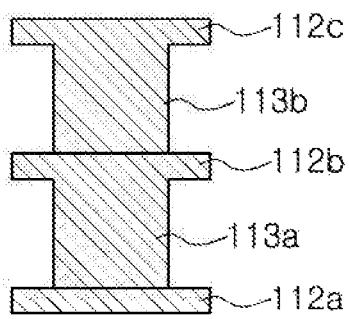
Figure 11D:
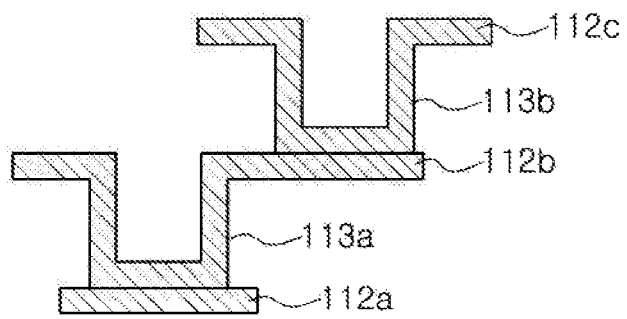

FIG. 10 is a cut-away plan diagram of the fan-out semiconductor package taken along line I-I' of FIG. 9.

Referring to FIGS. 9 and 10, a fan-out semiconductor package 100A according to an example may include a first connection member 110 having a through hole 110H; a semiconductor chip 120 disposed in the through hole 110H of the first connection member 110 and having an active surface on which a connection pad 122 is disposed and a non-active surface opposing the active surface; an encapsulant 130 at least partially encapsulating the first connection member 110 and the non-active surface of the semiconductor chip 120; and a second connection member 140 disposed on the first connection member and the active surface of the semiconductor chip and including redistribution layers 142a and 142b electrically connected to the connection pad 122. The first connection member 110 may include a first insulating layer 111a contacting the second connection member 140, a first redistribution layer 112a contacting the second connection member 140 and embedded in the first insulating layer 111a, a second redistribution layer 112b disposed on the other side of the first insulating layer 111a opposing one side of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to the connection pad 122. The fan-out semiconductor package 100A according to the example may further include a passivation layer 150 disposed on the second connection member 140, an under-bump metallization layer 160 disposed on an opening 151 of the passivation layer 150, and a connection terminal 170 disposed on the under-bump metallization layer 160.

In general, a fan-out semiconductor package has a structure in which an encapsulant such as an epoxy molding compound (EMC), or the like, simply encapsulates and encloses the surroundings of a semiconductor chip, and a second connection member is formed below the semiconductor chip, thereby implementing redistribution of the semiconductor chip. However, in a case of simply encapsulating and enclosing the surroundings of the semiconductor chip using the encapsulant, it may be difficult to control warpage occurring due to various causes, there is a limitation in fixing the semiconductor chip, and it may be difficult to utilize an encapsulation area as a routing area, such that a degree of freedom in design, or the like, may be deteriorated.

Figure 34:
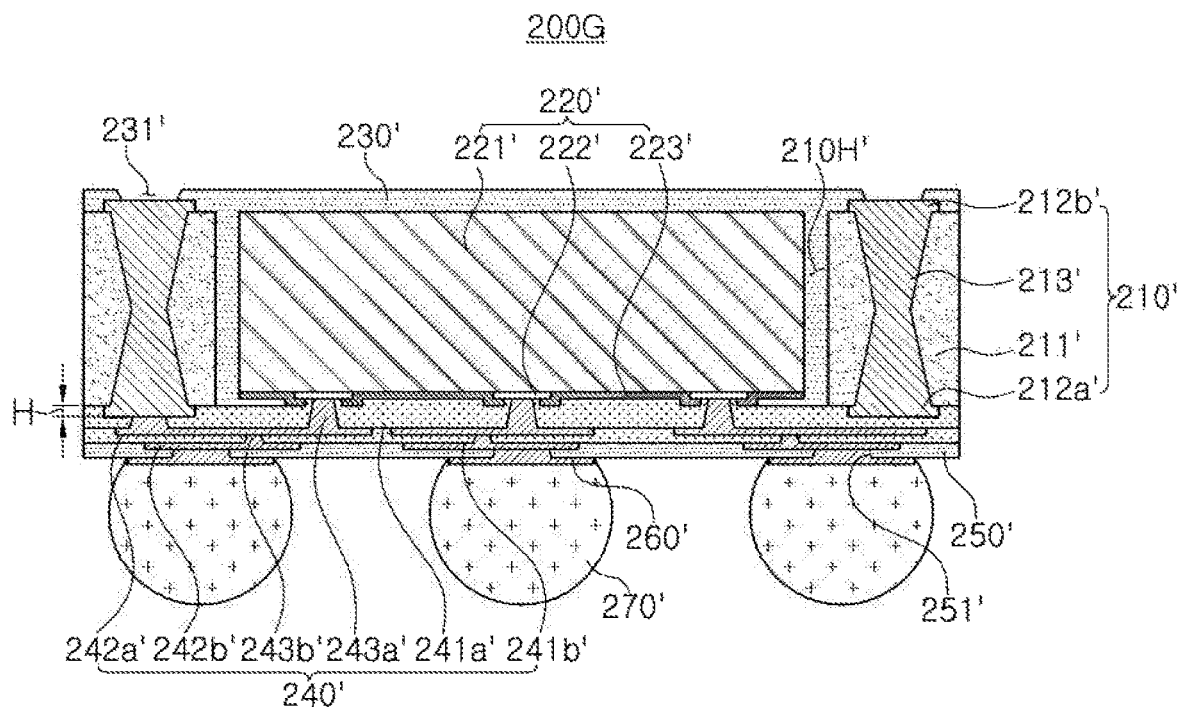
FIG. 34 is a cross-sectional diagram schematically illustrating an example of a fan-out semiconductor package in which an insulating distance of a second connection member is non-uniform.

As a method of solving these problems, for example, a method of introducing a first connection member 210' having an insulating layer 211' having excellent rigidity into an area in which the semiconductor chip is encapsulated, and forming redistribution layers 212a' and 212b', a via 213', or the like, in the first connection member 210' as illustrated in FIG. 34 to provide a wider routing area while addressing a warpage problem may be considered. However, in this case, a step portion H may be generated by a thickness of the redistribution layer 212a' formed on one side of the first connection member 210'. The step portion H may allow an insulating distance of the second connection member 240' to be non-uniform. Generally, since the step portion H generated by the thickness of the redistribution layer 212a' may be at least 10 μm or so, non-uniformity of the insulating distance due to the step portion H may be a factor having a large influence on a design of a first via 243a' of the second connection member. That is, non-uniformity of the insulating distance may be a factor increasing difficulty in implementing a fine pitch of the via 243a' connected to a connection pad 222' of a semiconductor chip 220', and as a result, it may be difficult to design a high-density wiring of the second connection member 240'.

On the contrary, as in the fan-out semiconductor package 100A according to the example, in a case in which the first redistribution layer 112a of the first connection member 110 contacting the second connection member 140 is embedded in the first insulating layer 111a, a step portion generated due to a thickness of the first redistribution layer 112a may be significantly decreased, such that an insulating distance of the second connection member 140 may be constant. That is, a difference between a distance from the redistribution layer 142a of the second connection member 140 to a lower surface of the first insulating layer 111a and a distance from the redistribution layer 142a of the second connection member 140 to the connection pad 122 may be less than the thickness of the first redistribution layer 112a. Therefore, it may be easy to design a high-density wiring of the second connection member 140.

Hereinafter, each of the configurations included in the fan-out semiconductor package 100A according to the example will be described in more detail.

The first connection member 110 may include the redistribution layers 112a and 112b redistributing the connection pad 122 of the semiconductor chip 120, thereby decreasing the number of layers of the second connection member 140. If necessary, the first connection member 110 may maintain rigidity of the package 100A depending on a specific material, and serve to secure thickness uniformity of the encapsulant 130, or the like. In some cases, the fan-out semiconductor package 100A according to the exemplary may be used as a portion of a package on package by the first connection member 110. The first connection member 110 may have the through hole 110H. The semiconductor chip 120 may be disposed in the through hole 110H to be spaced apart from the first connection member 110 by a predetermined distance. The side surfaces of the semiconductor chip 120 may be surrounded by the first connection member 110. However, this is only an example, and a disposition form of the first connection member 110 may be variously changed, and the first connection member 110 may perform a different function depending on the disposition form.

The first connection member 110 may include the first insulating layer 111a contacting the second connection member 140, the first redistribution layer 112a contacting the second connection member 140 and embedded in the first insulating layer 111a, the second redistribution layer 112b disposed on the other side of the first insulating layer 111a opposing the side of the first insulating layer 111a in which the first redistribution layer 112a is embedded, the second insulating layer 111b disposed on the first insulating layer 111a and covering the second redistribution layer 112b, and the third redistribution layer 112c disposed on the second insulating layer 111b. The first to third redistribution layers 112a, 112b, and 112c may be electrically connected to the connection pad 122. The first connection member 110 may include a first via 113a electrically connecting the first and second redistribution layers 112a and 112b to each other while penetrating through the first insulating layer 111a and a second via 113b electrically connecting the second and third redistribution layers 112b and 112c to each other while penetrating through the second insulating layer 111b. Since the first redistribution layer 112a is embedded, an insulating distance of a first insulating layer 141a of the second connection member may be substantially constant, as described above. Since the first connection member 110 includes a large number of redistribution layers 112a, 112b, and 112c, the second connection member 140 may be further simplified. Therefore, a decrease in yield due to defects occurring during forming the second connection member 140 may be decreased.

A material of the insulating layers 111a and 111b is not particularly limited. For example, an insulating material may be used. Here, as the insulating material, a thermosetting resin such as an epoxy resin, a thermoplastic resin such as a polyimide, or a resin in which the thermosetting resin or the thermoplastic resin is impregnated into a core material, such as a glass cloth, glass fabric, or the like, together with an inorganic filler, for example, a prepreg, an Ajinomoto build-up film (ABF), FR-4, a bismaleimide triazine (BT) resin, or the like, may be used. If necessary, a photoimagable dielectric (PID) resin may also be used. The first and second insulating layers 111a and 111b may contain the same insulating material as each other, and have an obscured boundary therebetween, but are not limited thereto.

The redistribution layers 112a, 112b, and 112c may serve to redistribute the connection pad 122 of the semiconductor chip 120, and as a material for forming the redistribution layers 112a, 112b, and 112c, a conductive material such as copper (Cu), aluminum (Al), silver (Ag), tin (Sn), gold (Au), nickel (Ni), lead (Pb), titanium (Ti), alloys thereof, or the like, may be used. The redistribution layers 112a, 112b, and 112c may perform various functions depending on a design of the corresponding layer. For example, the redistribution layers 112a, 112b, and 112c may include aground (GND) pattern, a power (PWR) pattern, a signal (S) pattern, or the like. Here, the S pattern may include various signal patterns, for example, a data signal pattern, or the like, except for the GND pattern, the PWR pattern, and the like. In addition, the redistribution layers 112a, 112b, and 112c may include a via pad, a connection terminal pad, or the like. As a non-restrictive example, all of the redistribution layers 112a, 112b, and 112c may include the GND pattern. In this case, formation of GND pattern on the redistribution layers 142a and 142b of the second connection member 140 may be significantly decreased, such that a degree of freedom in designing a wiring may be improved.

If necessary, a surface treatment layer (not illustrated) may be further formed on the redistribution layer 112c exposed through an opening 131 formed in the encapsulant 130, among the redistribution layers 112a, 112b, and 112c. The surface treatment layer (not illustrated) is not particularly limited as long as it is known in the art. For example, the surface treatment layer may be formed by electrolytic gold plating, electroless gold plating, an organic solderability preservative (OSP) surface treatment or electroless tin-plating, electroless silver plating, electroless nickel plating/ immersion gold plating, direct immersion gold (DIG) plating, hot air solder leveling (HASL), or the like.

The vias 113a and 113b may electrically connect the redistribution layers 112a, 112b, and 112c formed on different layers to each other, thereby forming an electrical path in the first connection member 110. As a material for forming the vias 113a and 113b, a conductive material may also be used. As illustrated in FIGS. 11A through 11D, the vias 113a and 113b may be completely filled with the conductive material, or may be formed by forming the conductive material on a wall surface of a via hole. Further, the vias 113a and 113b may have all shapes known in the art such as a cylindrical shape, and the like, in addition to a tapered shape. Meanwhile, as known through a process to be described below, when a hole for the first via 113a is formed, some pads of the first redistribution layer 112a may serve as a stopper, and when a hole for the second via 113b is formed, some pads of the second redistribution layer 112b may serve as a stopper. Therefore, the first and second vias 113a and 113b have a tapered shape of which a width of an upper surface is wider than that of a lower surface, which may be advantageous in terms of the process. In this case, the first via 113a may be integrated with a portion of the second redistribution layer 112b, and the second via 113b may be integrated with a portion of the third redistribution layer 112c.

The semiconductor chip 120 may be an integrated circuit (IC) indicating a chip in which at least hundreds to millions or more of various elements are integrated. The integrated circuit may be, for example, an application process chip such as a central processor (for example, a central processing unit (CPU)), a graphics processor (for example, a graphics processing unit (GPU)), a digital signal processor, a cryptographic processor, a microprocessor, a microcontroller, or the like, but is not limited thereto. The semiconductor chip 120 may be formed, for example, based on an active wafer. In this case, as a base material of a body 121, silicon (Si), germanium (Ge), gallium arsenide (GaAs), or the like, may be used. Various circuits may be formed in the body 121. The connection pad 122 may be configured for electrically connecting the semiconductor chip 120 to another component. As a material for forming the connection pad 122, any conductive material such as aluminum (Al), or the like, may be used without particular limitation. A passivation film 123 exposing the connection pad 122 may be formed on the body 121. The passivation film 123 may be formed of an oxide film, a nitride film, or the like. Alternatively, the passivation film 123 may be formed of a double layer of an oxide film and a nitride film. A step portion may be formed between a lower surface of the connection pad 122 and a lower surface of the encapsulant 130 by the passivation film 123. As a result, bleeding of the encapsulant 130 into the lower surface of the connection pad 122 may be somewhat prevented. An insulating film (not illustrated), or the like, may be further disposed on any other required position.

The non-active surface of the semiconductor chip 120 may be positioned to be lower than an upper surface of the third redistribution layer 112c of the first connection member 110. For example, the non-active surface of the semiconductor chip 120 may be positioned to be lower than an upper surface of the second insulating layer 111b of the first connection member 110. A height difference between the non-active surface of the semiconductor chip 120 and the upper surface of the third redistribution layer 112c of the first connection member 110 may be 2 μm or more, for example, 5 μm or more. In this case, cracks occurring in a corner portion of the non-active surface of the semiconductor chip 120 may be effectively prevented. Further, at the time of applying the encapsulant 130, a deviation in the insulating distance on the non-active surface of the semiconductor chip 120 may be significantly decreased.

The second redistribution layer 112b of the first connection member 110 may be positioned between the active surface and the non-active surface of the semiconductor chip 120. The first connection member 110 may be formed to have a thickness corresponding to a thickness of the semiconductor chip 120. Therefore, the second redistribution layer 112b formed in the first connection member 110 may be disposed at a level between the active surface and the non-active surface of the semiconductor chip 120.

The encapsulant 130 may protect the first connection member 110 and/or the semiconductor chip 120. A shape of the encapsulant 130 is not particularly limited as long as the encapsulant 130 at least partially encloses the first connection member 110 and/or the semiconductor chip 120. For example, the encapsulant 130 may cover the first connection member 110 and the non-active surface of the semiconductor chip 120, and fill a space between a wall surface of the through hole 110H and side surfaces of the semiconductor chip 120. Further, the encapsulant 130 may at least partially fill a space between the passivation film 123 of the semiconductor chip 120 and the second connection member 140. Meanwhile, the encapsulant 130 fills the through hole 110H, thereby serving to decrease buckling while serving as an adhesive, depending on a specific material of the encapsulant 130.

A specific material of the encapsulant 130 is not particularly limited. For example, as the material of the encapsulant 130, an insulating material may be used. Here, as the insulating material, a thermosetting resin such as an epoxy resin, a thermoplastic resin such as polyimide, or a resin in which a reinforcing material, such as an inorganic filler, is impregnated in the thermosetting resin and the thermoplastic resin, for example, ABF, FR-4, a BT resin, a PID resin, or the like, may be used. Further, a molding material known in the art such as an epoxy molding compound (EMC), or the like, may also be used. If necessary, a resin in which a thermosetting resin or thermoplastic resin is impregnated into a core material, such as a glass cloth, a glass fabric, or the like, together with an inorganic filler, may also be used.

The encapsulant 130 may be composed of a plurality of layers formed of a plurality of materials. For example, a space in the through hole 110H may be filled with a first encapsulant, and then, the first connection member 110 and the semiconductor chip 120 may be covered with a second encapsulant. Alternatively, after covering the first connection member 110 and the semiconductor chip 120 at a predetermined thickness while filling the space in the through hole 110H using the first encapsulant, the second encapsulant may be disposed on the first encapsulant again at a predetermined thickness. Besides, the encapsulant 130 may be applied in various forms.

If necessary, conductive particles may be contained in the encapsulant 130 for shielding electromagnetic waves. Any conductive particle may be used as long as it may shield the electromagnetic wave. For example, the conductive particle may be formed of copper (Cu), aluminum (Al), silver (Ag), tin (Sn), gold (Au), nickel (Ni), lead (Pb), titanium (Ti), solder, or the like. However, these materials are only examples, and the conductive particle is not particularly limited thereto.

The second connection member 140 may be configured for redistributing the connection pad 122 of the semiconductor chip 120. Several tens to several hundreds of connection pads 122 having various functions may be redistributed through the second connection member 140, and physically and/or electrically connected to the outside depending on the functions thereof through connection terminals 170 to be described below. The second connection member 140 may include insulating layers 141a and 141b, redistribution layers 142a and 142b disposed on the insulating layers 141a and 141b, and vias 143a and 143b connecting the redistribution layers 142a and 142b to each other while penetrating through the insulating layers 141a and 141b. In the fan-out semiconductor package 100A according to the example, the second connection member 140 may be composed of a plurality of redistribution layers 142a and 142b. However, the second connection member 140 is not limited thereto, but may also be composed of a single layer. In addition, the second connection member 140 may also have a different number of layers.

As a material of the insulating layers 141a and 141b, an insulating material may be used. In this case, as the insulating material, a photosensitive insulating material such as a photoimagable dielectric (PID) resin in addition to the above-mentioned insulating materials may also be used. In this case, the insulating layers 141a and 141b may be formed to be thinner, and fine pitches of the vias 143a and 143b may be more easily implemented. The insulating layers 141a and 141b may be formed of the same material as each other, or different materials from each other, if necessary. The insulating layers 141a and 141b may be integrated with each other depending on a process, such that a boundary therebetween may be obscure.

The redistribution layers 142a and 142b may serve to substantially redistribute the connection pad 122, and as a material for forming the redistribution layers 142a and 142b, a conductive material such as copper (Cu), aluminum (Al), silver (Ag), tin (Sn), gold (Au), nickel (Ni), lead (Pb), titanium (Ti), alloys thereof, or the like, may be used. The redistribution layers 142a and 142b may perform various functions depending on a design of the corresponding layer. For example, the redistribution layers 142a and 142b may include a ground (GND) pattern, a power (PWR) pattern, a signal (S) pattern, or the like. Here, the S pattern may include various signal patterns, for example, a data signal pattern, or the like, except for the GND pattern, the PWR pattern, and the like. In addition, the redistribution layers 142a and 142b may include a via pad, a connection terminal pad, or the like.

If necessary, a surface treatment layer (not illustrated) may further be formed on the redistribution layer 142b which is partially exposed, among the redistribution layers 142a and 142b. The surface treatment layer (not illustrated) is not particularly limited as long as it is known in the art. For example, the surface treatment layer may be formed by electrolytic gold plating, electroless gold plating, an organic solderability preservative (OSP) surface treatment or electroless tin plating, electroless silver plating, electroless nickel plating/immersion gold plating, direct immersion gold (DIG) plating, hot air solder leveling (HASL), or the like.

The vias 143a and 143b may electrically connect the redistribution layers 142a and 142b formed on different layers, the connection pad 122, and the like, to each other, thereby forming an electrical path in the package 100A. As a material for forming the vias 143a and 143b, a conductive material such as copper (Cu), aluminum (Al), silver (Ag), tin (Sn), gold (Au), nickel (Ni), lead (Pb), titanium (Ti), alloys thereof, or the like, may be used. The vias 143a and 143b may be completely filled with the conductive material, or the conductive material may also be formed on walls of the vias. Further, the vias 143a and 143b may have all shapes known in the art such as a tapered shape, a cylindrical shape, and the like.

A thickness of the redistribution layers 112a, 112b, and 112c of the first connection member 110 may be thicker than that of the redistribution layers 142a and 142b of the second connection member 140. The first connection member 110 may have a thickness equal to or thicker than that of the semiconductor chip 120, and thus the redistribution layers 112a, 112b, and 112c formed therein may also be relatively thick in accordance with the thickness of the first connection member 110. On the contrary, the redistribution layers 142a and 142b of the second connection member 140 may be formed to be relatively thinner than the redistribution layers 112a, 112b, and 112c of the first connection member 110 in order to thin the second connection member 140.

The passivation layer 150 may be additionally configured for protecting the second connection member 140 from external physical or chemical damage, or the like. The passivation layer 150 may have an opening 151 at least partially exposing the redistribution layer 142b among the redistribution layers 142a and 142b of the second connection member 140. The opening 151 may expose the entire one surface of the redistribution layer 142b or only a portion of one surface thereof. A material of the passivation layer 150 is not particularly limited. For example, a photosensitive insulating material such as a photosensitive insulating resin may be used. Alternatively, a solder resist may also be used as the material of the passivation layer 150. Alternatively, an insulating resin which does not contain a core material but contains a filler, for example, an Ajinomoto Build-up Film (ABF) containing an inorganic filler and an epoxy resin, or the like, may be used.

The under-bump metallization layer 160 may be additionally configured for improving connection reliability of the connection terminal 170 to improve board level reliability. The under-bump metallization layer 160 may be disposed on an inner wall surface of the opening 151 of the passivation layer 150 and the exposed redistribution layer 142b of the second connection member 140. The under-bump metallization layer 160 may be formed of a conductive material known in the art, that is, a metal using a metallization method known in the art.

The connection terminal 170 may be additionally configured for physically and/or electrically connecting the fan-out semiconductor package 100A to the outside. For example, the fan-out semiconductor package 100A may be mounted on a main board of an electronic device through the connection terminal 170. The connection terminal 170 may be formed of a conductive material, for example, solder, or the like. However, the material is only an example, and the material of the connection terminal is not particularly limited thereto. The connection terminal 170 may be a land, a ball, a pin, or the like. The connection terminal 170 may be formed of a multilayer or single layer. In a case in which the connection terminal 170 is formed of the multilayer, the connection terminal 170 may contain a copper pillar and solder, and in a case in which the connection terminal 170 is formed of the single layer, the connection terminal 170 may contain tin-silver solder or copper. However, these cases are only examples, and the connection terminal 170 is not limited thereto. The number, an interval, a disposition shape, and the like, of connection terminal 170 are not particularly limited, but may be sufficiently changed by a person skilled in the art depending on a design. For example, the number of connection terminal 170 may be several tens to several thousands depending on the number of connection pads 122 of the semiconductor chip 120. Alternatively, the number of connection terminal 170 may be more than or less than the above-mentioned range.

At least one of the connection terminals 170 may be disposed in a fan-out region. The fan-out region may be a region deviating from a region in which the semiconductor chip 120 is disposed. That is, the semiconductor package 100A according to the example may be a fan-out package. In the case of the fan-out package, reliability may be better as compared to a fan-in package, a plurality of I/O terminals may be implemented, and 3D interconnection may be easily performed. Further, since the fan-out package may be mounted on an electronic device without a separate board as compared to a ball grid array (BGA) package, a land grid array (LGA) package, or the like, the fan-out package may be manufactured to have a reduced thickness, and price competitiveness may be excellent.

Although not illustrated, if necessary, a plurality of semiconductor chips (not illustrated) may be disposed in the through hole 110H of the first connection member 110. In addition, a plurality of through holes 110H (not illustrated)

may be formed in the first connection member 110, and a semiconductor chip (not illustrated) may be disposed in each of the through holes. Further, a separate passive component (not illustrated), for example, a condenser, an inductor, or the like, in addition to the semiconductor chip, may be encapsulated together with each other in the through hole 110H. In addition, a surface mounting component (not illustrated) may be mounted on the passivation layer 150.

FIGS. 12A through 12D illustrate an example of a schematic manufacturing process of the fan-out semiconductor package of FIG. 9.

Figure 12A:
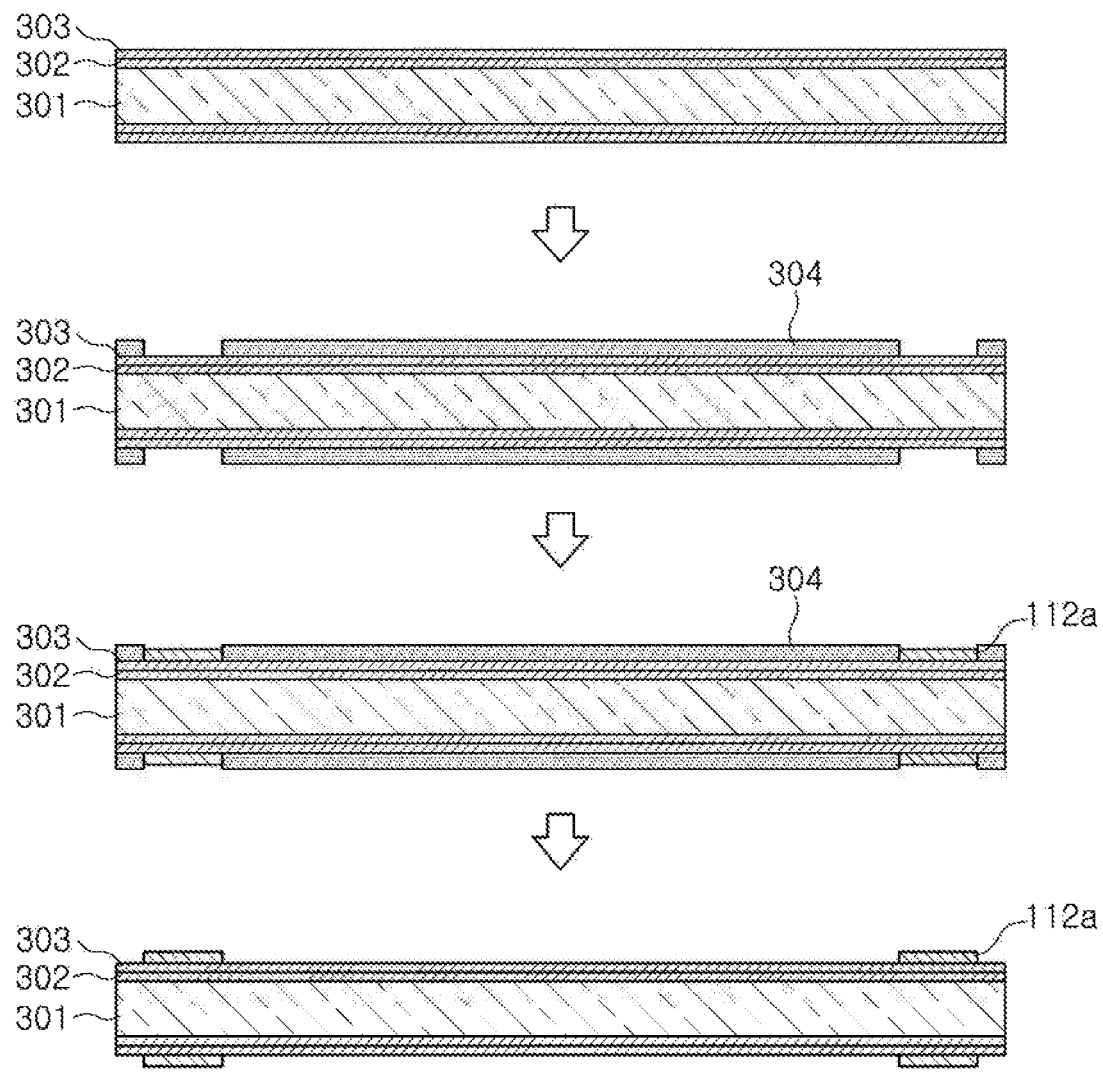
FIGS. 12A through 12D illustrate an example of a schematic manufacturing process of the fan-out semiconductor package of FIG. 9.

Referring to FIG. 12A, first, a carrier film 301 may be prepared. Metal films 302 and 303 may be formed on one surface or the both surfaces of the carrier film 301. An adhesive surface between the metal films 302 and 303 may be surface-treated so as to facilitate separation in a subsequent separation process. Alternatively, a release layer may be provided between the metal films 302 and 303, thereby facilitating separation in a subsequent process. The carrier film 301 may be an insulating substrate known in the art, and a material thereof is not limited. The metal films 302 and 303 may be generally formed of copper (Cu) foil, but are not limited thereto. The metal films 302 and 303 may be thin films formed of another conductive material. In addition, patterning for forming the first redistribution layer 112a may be performed using a dry film 304. The patterning may be performed using a photolithography method known in the art. The dry film 304 may be a dry film formed of a photosensitive material, known in the art. Then, the first redistribution layer 112a may be formed by filling a patterned space of the dry film 304 with a conductive material. In this case, a plating method may be used, and the metal film 303 may serve as a seed layer. The plating method may be an electrolytic plating method, an electroless plating method, or the like. In more detail, the first redistribution layer 112a may be formed using a chemical vapor deposition (CVD) method, a physical vapor deposition (PVD) method, a sputtering method, a subtractive method, an additive method, a semi-additive process (SAP), a modified semi-additive process (MSAP), or the like, but is not limited thereto. Next, the dry film 304 may be removed. The dry film 304 may be removed by a method known in the art, for example, an etching method, or the like.

Figure 12B:
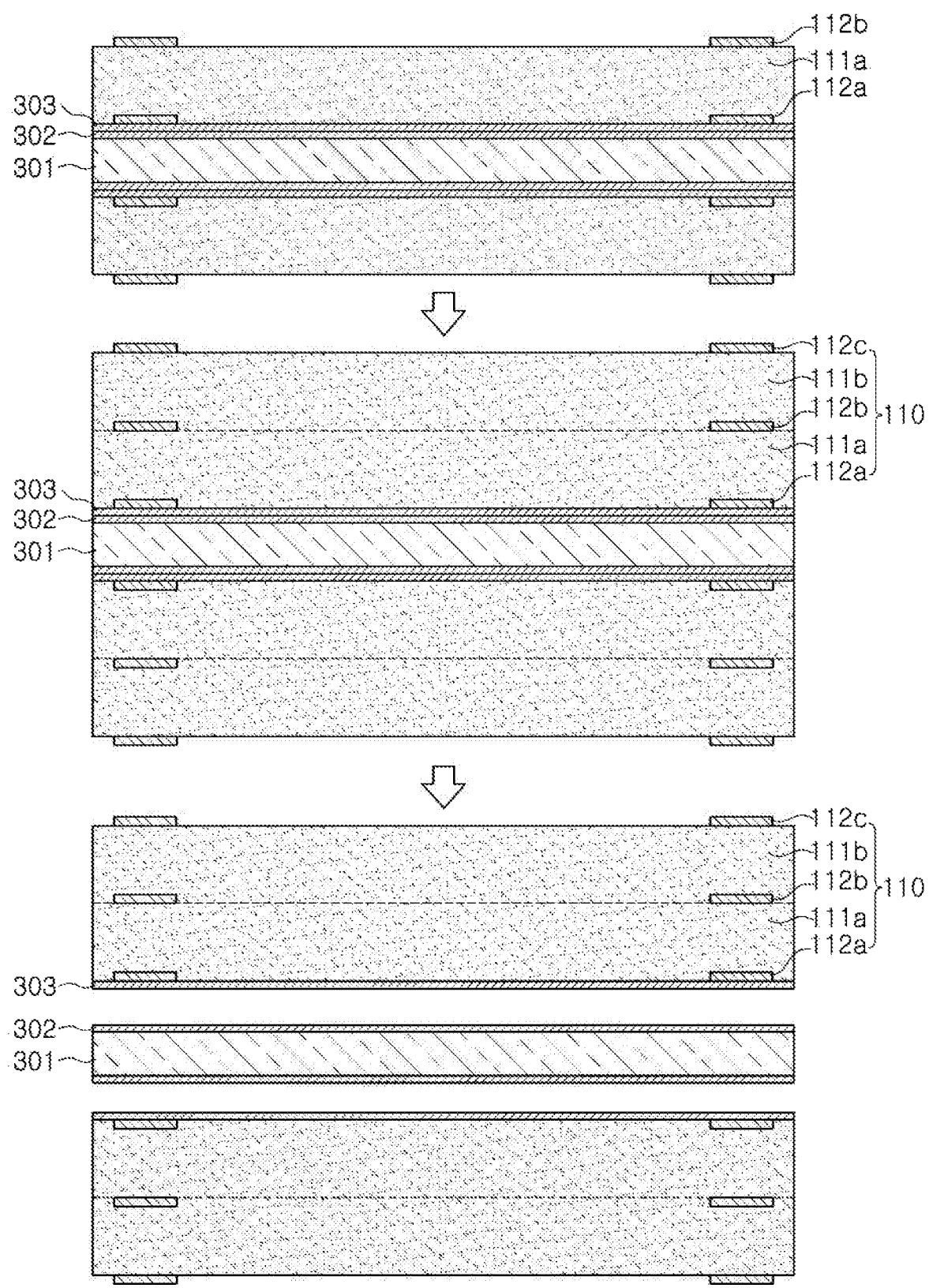

Referring to FIG. 12B, next, the first insulating layer 111a in which the redistribution layer 112a is at least partially embedded may be formed on the metal film 303. Then, the first via 113a penetrating through the first insulating layer 111a may be formed. In addition, the second redistribution layer 112b may be formed on the first insulating layer 111a. The first insulating layer 111a may be formed by a method of laminating a precursor of the first insulating layer 111a using a lamination method known in the art and curing the laminated precursor, or a method of applying a precursor material using an application method known in the art and curing the applied precursor material, or the like. The first via 113a and the second redistribution layer 112b may be formed by a method of forming a via hole in the first insulating layer 111a using a photolithography method, a mechanical drill, a laser drill, and/or the like, performing patterning using a dry film, or the like, and filling the via hole and the patterned space using a plating method, or the like. Next, the second insulating layer 111b covering the second redistribution layer 112b may be formed on the first insulating layer 111a. Thereafter, the second via 113b penetrating through the second insulating layer 111b may be formed. In addition, the third redistribution layer 112c may be formed on the second insulating layer 111b. Methods for forming the second insulating layer 111b, the second via 113b, and the third redistribution layer 112c are as described above. Next, the carrier film 301 may be delaminated. In this case, at the time of delamination, the metal films 302 and 303 may be separated from each other. In this case, the metal films 302 and 303 may be separated using a blade, but are not limited thereto. All of the methods known in the art may be used. Meanwhile, in a series of processes, a case in which the first connection member 110 is formed before delamination of the carrier film 301 is described, but the sequence is not limited thereto. That is, after delamination of the carrier film 301, the first connection member 110 may also be formed by the above-mentioned method. That is, the sequence is not necessarily limited to the above-mentioned sequence.

Figure 12C:
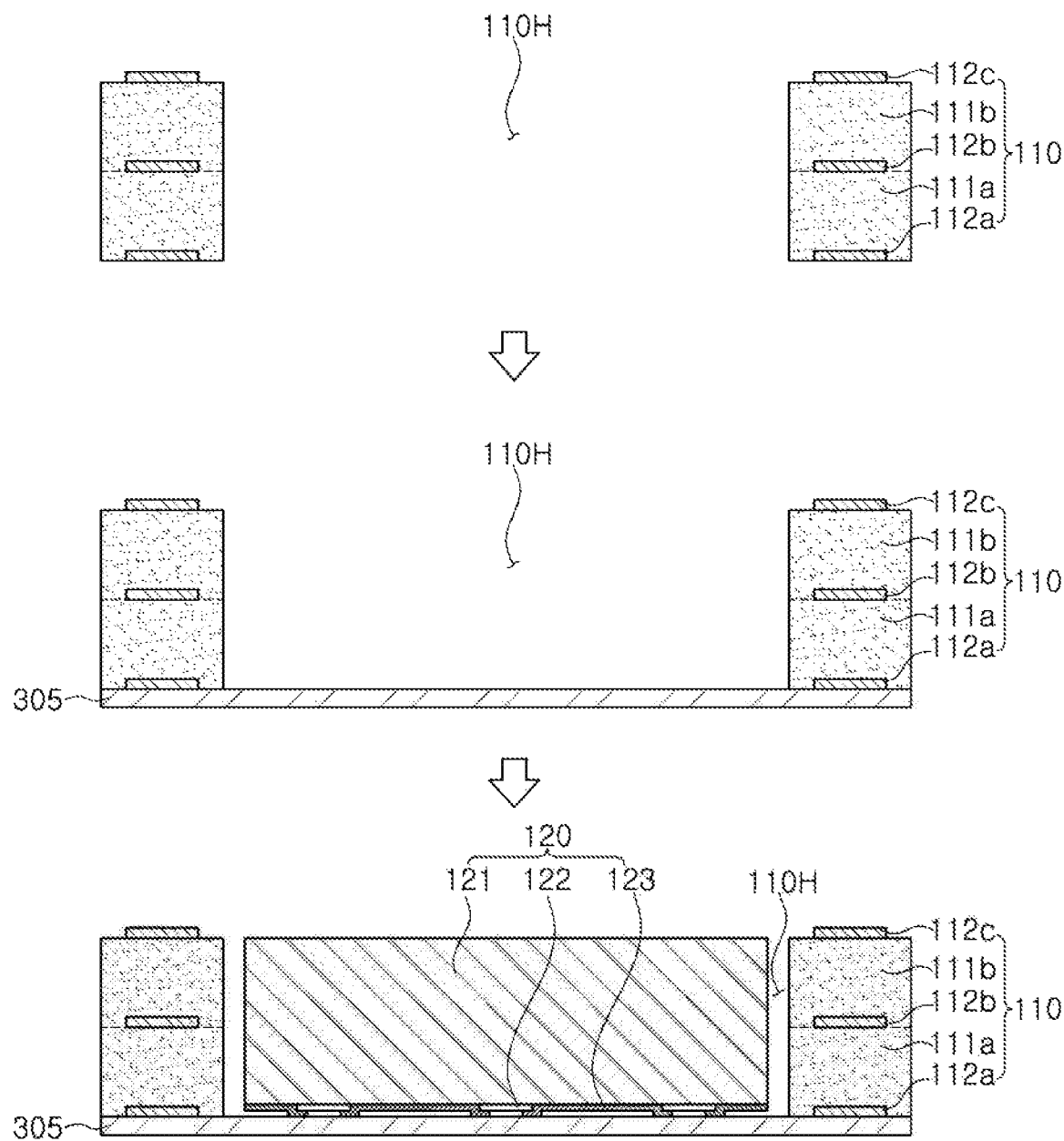

Referring to FIG. 12C, next, the remaining metal film 303 may be removed by an etching method known in the art, or the like, and the through hole 110H may be formed in the first connection member 110. The through hole 110H may be formed using a mechanical drilling process and/or a laser drilling process. However, the through hole 110H is not limited thereto, but may be formed by a sandblasting method using polishing particles, a dry etching method using plasma, or the like. In a case in which the through hole 110H is formed using the mechanical drilling process and/or the laser drilling process, a desmearing treatment such as a permanganate method, or the like, may be performed to remove resin smear in the through hole 110H. Further, an adhesive film 305 may be attached to one side of the first connection member 110. As the adhesive film 305, any adhesive film may be used as long as it may fix the first connection member 110. As a non-restrictive example, a tape known in the art, or the like, may be used. Examples of the tape known in the art may include a thermosetting adhesive tape of which adhesive force is decreased by a heat treatment, a UV curable adhesive tape of which adhesive force is deteriorated by UV irradiation, and the like. Next, the semiconductor chip 120 may be disposed in the through hole 110H of the first connection member 110. For example, the semiconductor chip 120 may be disposed in the through hole 110H by adhering the semiconductor chip 120 to the adhesive film 305 in the through hole 110H. The semiconductor chip 120 may be disposed in face down form so that the connection pad 122 is adhered to the adhesive film 305.

Figure 12D:
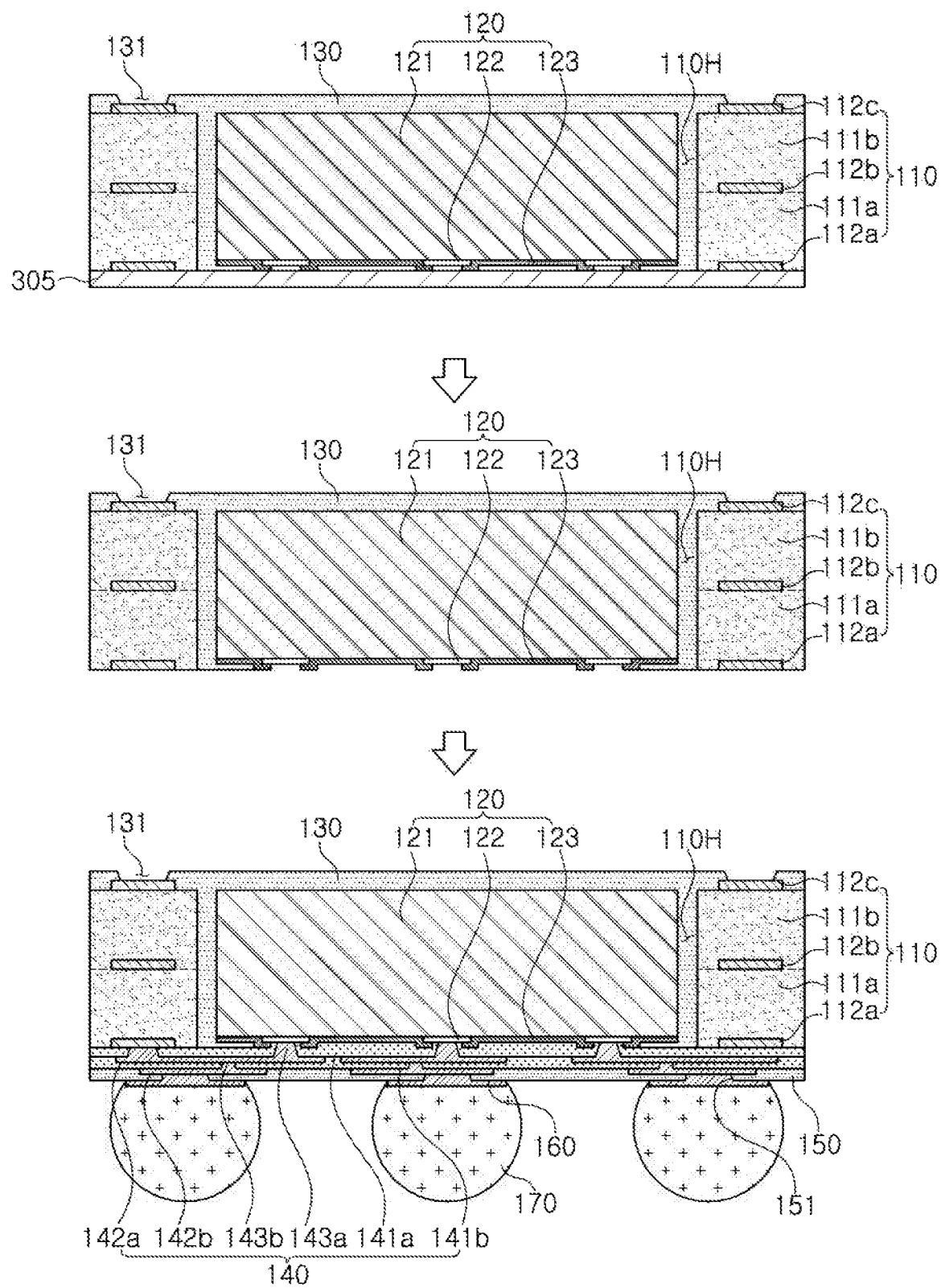

Referring to FIG. 12D, next, the semiconductor chip 120 may be encapsulated using the encapsulant 130. The encapsulant 130 may fill a space in the through hole 110H while at least encapsulating the first connection member 110 and the non-active surface of the semiconductor chip 120. The encapsulant 130 may be formed by a method known in the art. For example, the encapsulant 130 may be formed by laminating a precursor of the encapsulant 130 and curing the laminated precursor. Alternatively, the encapsulant 130 may be applied so as to encapsulate the semiconductor chip 120 on the adhesive film 305 and then cured. The semiconductor chip 120 may be fixed by curing. As the method of laminating the precursor, for example, a method of performing a hot press method of pressing the precursor at a high temperature for a predetermined time, decompressing the precursor, and then cooling the precursor to a room temperature, cooling the precursor in a cold press process, and then separating a work tool, or the like, may be used. As an application method, for example, a screen printing method of applying ink using a squeegee, a spray printing method of misting ink to apply the ink, or the like, may be used. Then, the adhesive film 305 may be delaminated. A delamination method is not particularly limited, but a method known in the art may be used. For example, in a case in which the thermosetting adhesive tape of which adhesive force is deteriorated by a heat treatment or the UV curable adhesive tape of which adhesive force is deteriorated by UV irradiation is used as the adhesive film 305, the adhesive film 305 may be delaminated after deteriorating adhesive force by performing heat treatment or UV irradiation on the adhesive film 305. Next, the second connection member 140 may be formed on the first connection member 110 and the active surface of the semiconductor chip 120 from which the adhesive film 305 is removed. The second connection member 140 may be formed by sequentially forming the insulating layers 141a and 141b, and forming the redistribution layers 142a and 142b and the vias 143a and 143b in the corresponding layers after forming the insulating layers 141a and 141b, respectively. If necessary, the passivation layer 150 may be formed on the second connection member 140. Similarly, the passivation layer 150 may be formed by a method of laminating a precursor of the passivation layer 150 and curing the laminated precursor, a method of applying a material for forming the passivation layer 150 and curing the applied material, or the like. The opening (151) may be formed in the passivation layer 150 so that the redistribution layer 142b of the second connection member 140 may be at least partially exposed, and the under-bump metallization layer 160 may also be formed thereon by a metallization method known in the art. If necessary, the connection terminal 170 may be formed on the under-bump metallization layer 160. A method of forming the connection terminal 170 is not particularly limited, but the connection terminal 170 may be formed by a method well-known in the art depending on a structure or shape thereof. The connection terminal 170 may be fixed by a reflow, and reliability may be improved by embedding a portion of the connection terminal 170 in the passivation layer 150 and exposing the other portion thereof to the outside in order to increase fixation force.

Meanwhile, in order to facilitate mass production, in a series of processes, after the carrier film 301 having a large size is prepared, a plurality of fan-out semiconductor packages 100A may be manufactured through the process as described above. Then, the plurality of the fan-out semiconductor packages 100A may be singulated into individual unit fan-out semiconductor packages 100A by cutting. In this case, productivity may be excellent.

Figure 13:
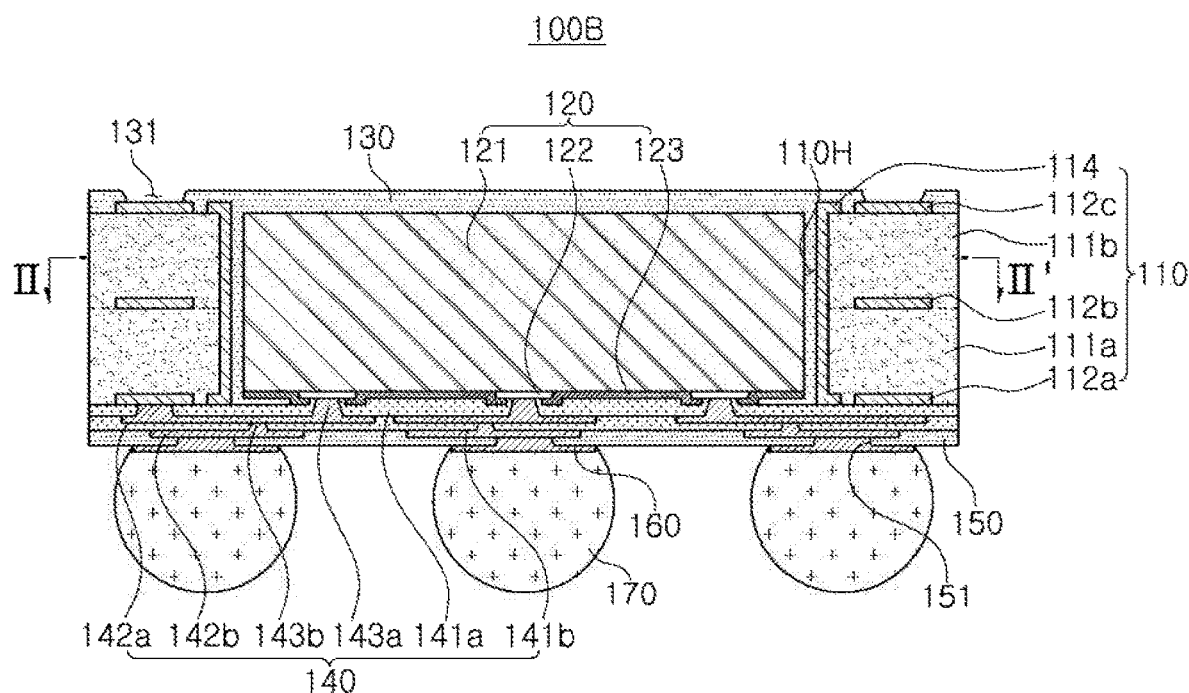
FIG. 13 is a cross-sectional diagram schematically illustrating a modified example of the fan-out semiconductor package of FIG. 9.

FIG. 13 is a cross-sectional diagram schematically illustrating a modified example of the fan-out semiconductor package of FIG. 9.

Figure 14:
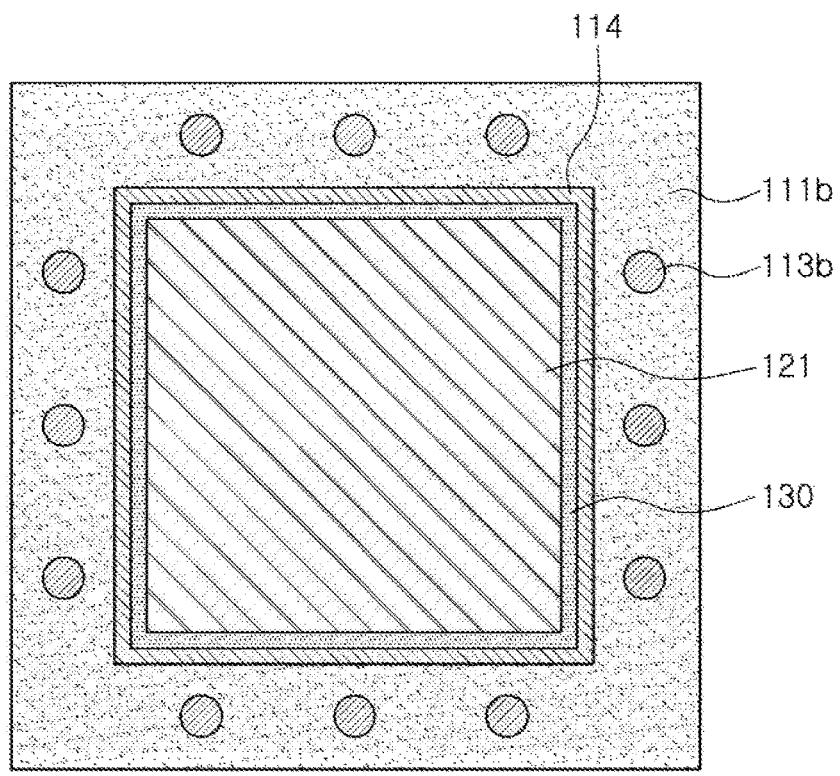
FIG. 14 is a cut-away plan diagram of the fan-out semiconductor package taken along line II-II' of FIG. 13.

FIG. 14 is a cut-away plan diagram of the fan-out semiconductor package taken along line II-II' of FIG. 13.

Referring to FIGS. 13 and 14, a fan-out semiconductor package 100B according to the modified example, a metal layer 114 may be disposed on an inner wall surface of the through hole 110H of the first connection member 110. The metal layer 114 may serve to effectively disperse heat generated in the semiconductor chip 120. Further, the metal layer 114 may also serve to shield electromagnetic waves. Further, the metal layer 114 may be connected to the ground patterns of other redistribution layers 112a, 112b, and 112c in the first connection member 110 to thereby be utilized as a ground. The metal layer 114 may be disposed on the entire wall surface, or patterned in a specific shape to thereby be disposed. The metal layer 114 may contain the conductive material as described above, that is, a metal material.

Since other configurations or a manufacturing method of the fan-out semiconductor package 100B are the same as those described in the fan-out semiconductor package 100A according to the example, descriptions thereof will be omitted.

Figure 15:
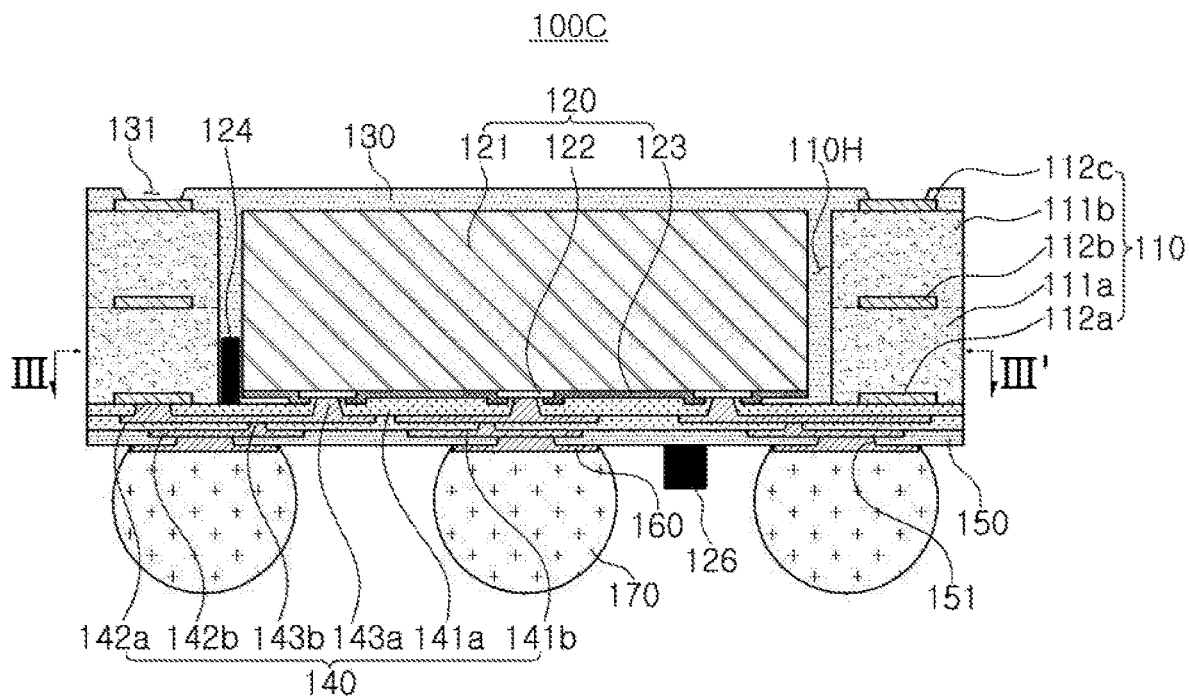
FIG. 15 is a cross-sectional diagram schematically illustrating a modified example of the fan-out semiconductor package of FIG. 9.

FIG. 15 is a cross-sectional diagram schematically illustrating a modified example of the fan-out semiconductor package of FIG. 9.

Figure 16:
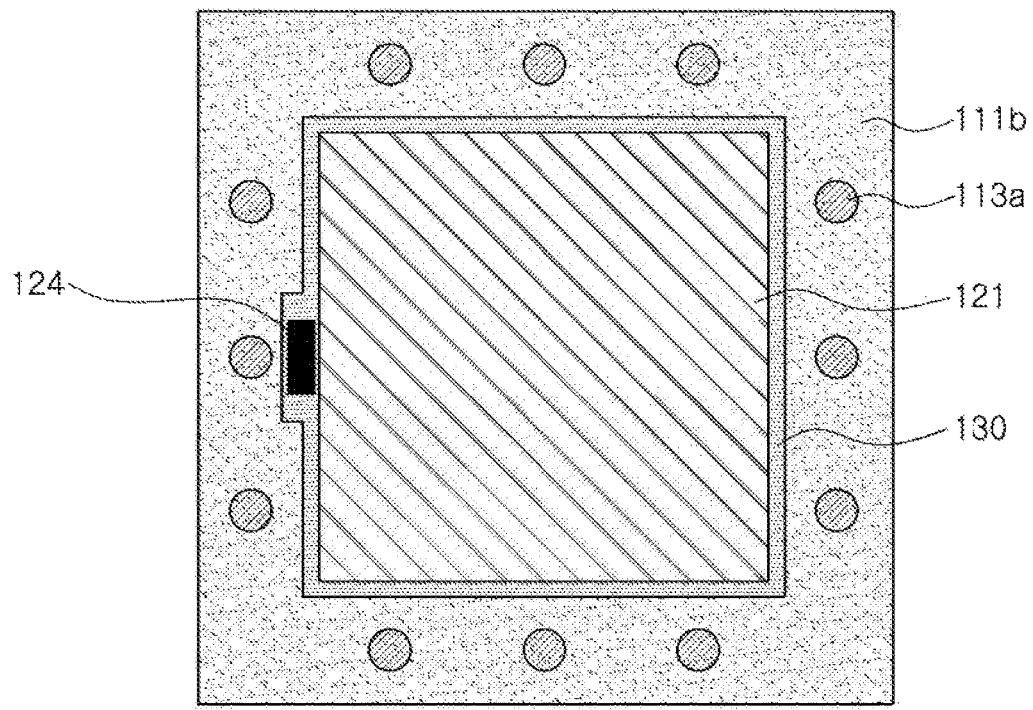
FIG. 16 is a cut-away plan diagram of the fan-out semiconductor package taken along line III-III' of FIG. 15.

FIG. 16 is a cut-away plan diagram of the fan-out semiconductor package taken along line III-III' of FIG. 15.

Referring to FIGS. 15 and 16, in a fan-out semiconductor package 100C according to the modified example, a separate first passive component 124 may be disposed in the through hole 110H. Further, a separate second passive component 126 may be disposed on a surface of the passivation layer 150. The first passive component 124 may be a high-capacitance capacitor, for example, a multilayer ceramic capacitor (MLCC), but is not limited thereto. The second passive component 126 may be a low-capacitance capacitor, for example, a Si based capacitor, but is not limited thereto. The first and second passive components 124 and 126 may be connected to the same power line to thereby be electrically connected to the semiconductor chip 120 through the power line, such that power supply efficiency may be improved.

Since other configurations or a manufacturing method of the fan-out semiconductor package 100C are the same as those described in the fan-out semiconductor package 100A according to the example, descriptions thereof will be omitted.

Figure 17:
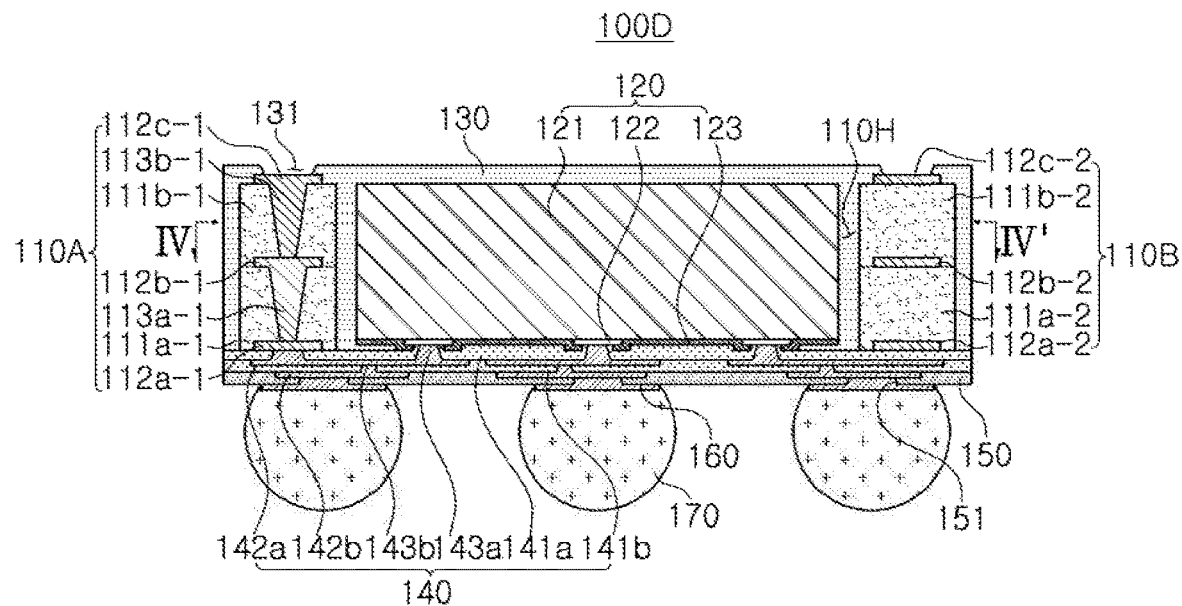
FIG. 17 is a cross-sectional diagram schematically illustrating a modified example of the fan-out semiconductor package of FIG. 9.

FIG. 17 is a cross-sectional diagram schematically illustrating a modified example of the fan-out semiconductor package of FIG. 9.

Figure 18:
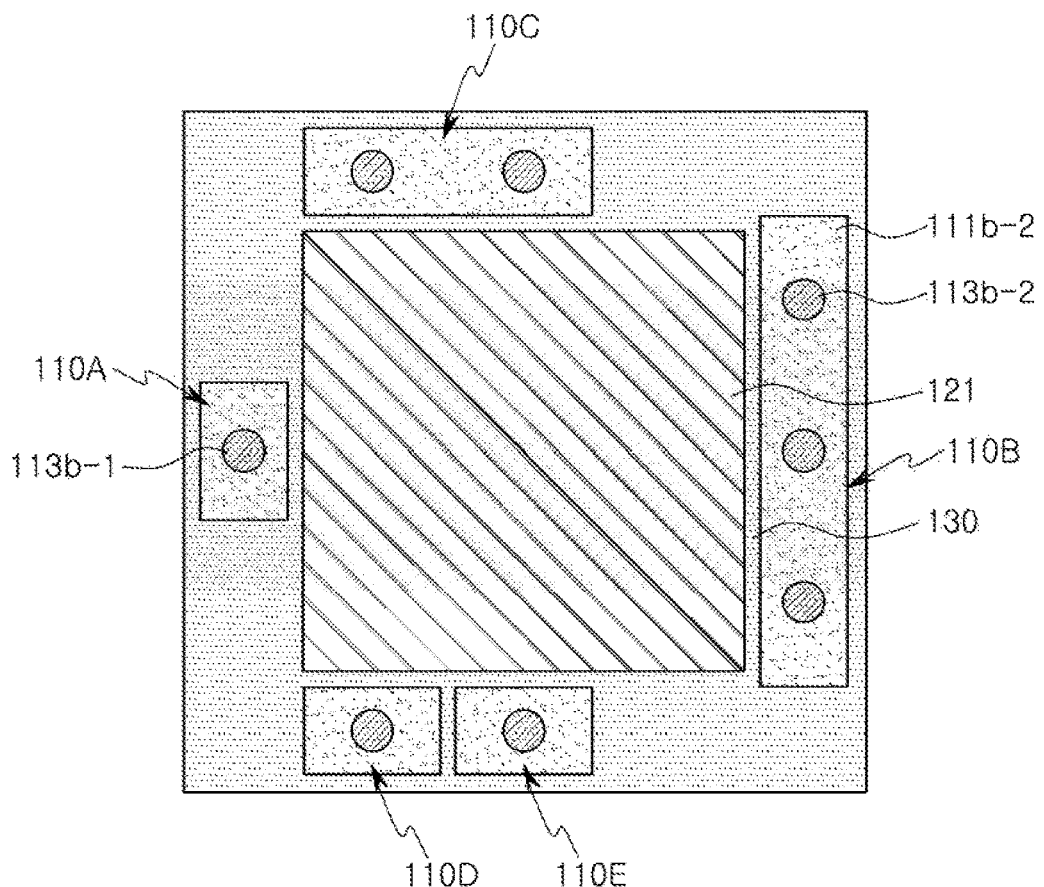
FIG. 18 is a cut-away plan diagram of the fan-out semiconductor package taken along line IV-IV' of FIG. 17.

FIG. 18 is a cut-away plan diagram of the fan-out semiconductor package taken along line IV-IV' of FIG. 17.

Referring to FIGS. 17 and 18, in a fan-out semiconductor package 100D according to the modified example, the first connection member 110 may be composed of one or more connection units 110A to 110E. The respective connection units 100A to 100E may be disposed around the semiconductor chip 120. The respective connection units 100A to 100E may include first insulating layers 111a-1, 111a-2, and the like; first redistribution layers 112a-1, 112a-2, and the like, embedded in the first insulating layers 111a-1, 111a-2, and the like, while contacting the second connection member 140; second redistribution layers 112b-1, 112b-2, and the like, disposed on the other sides of the first insulating layers 111a-1, 111a-2, and the like, opposing one sides of the first insulating layers 111a-1, 111a-2, and the like in which the first redistribution layers 112a-1, 112a-2, and the like, are embedded; second insulating layers 111b-1, 111b-2, and the like, disposed on the first insulating layers 111a-1, 111a-2, and the like, and covering the second redistribution layers 112b-1, 112b-2, and the like; and third redistribution layers 112c-1, 112c-2, and the like, disposed on the second insulating layers 111b-1, 111b-2, and the like, respectively. The first to third redistribution layers 112a-1, 112a-2, 112b-1, 112b-2, 112c-1, 112c-2, and the like, of the respective connection units 100A to 100E may be electrically connected to the connection pad 122. The encapsulant 130 may at least partially encapsulate the respective connection units 100A to 100E and the non-active surface of the semiconductor chip 120. The encapsulant 130 may encapsulate all side surfaces of the respective connection units 100A to 100E. As a result, the side surfaces of the respective connection units 100A to 100E may not be exposed externally.

Since other configurations or a manufacturing method of the fan-out semiconductor package 100D are the same as those described in the fan-out semiconductor package 100A according to the example, descriptions thereof will be omitted.

Figure 19:
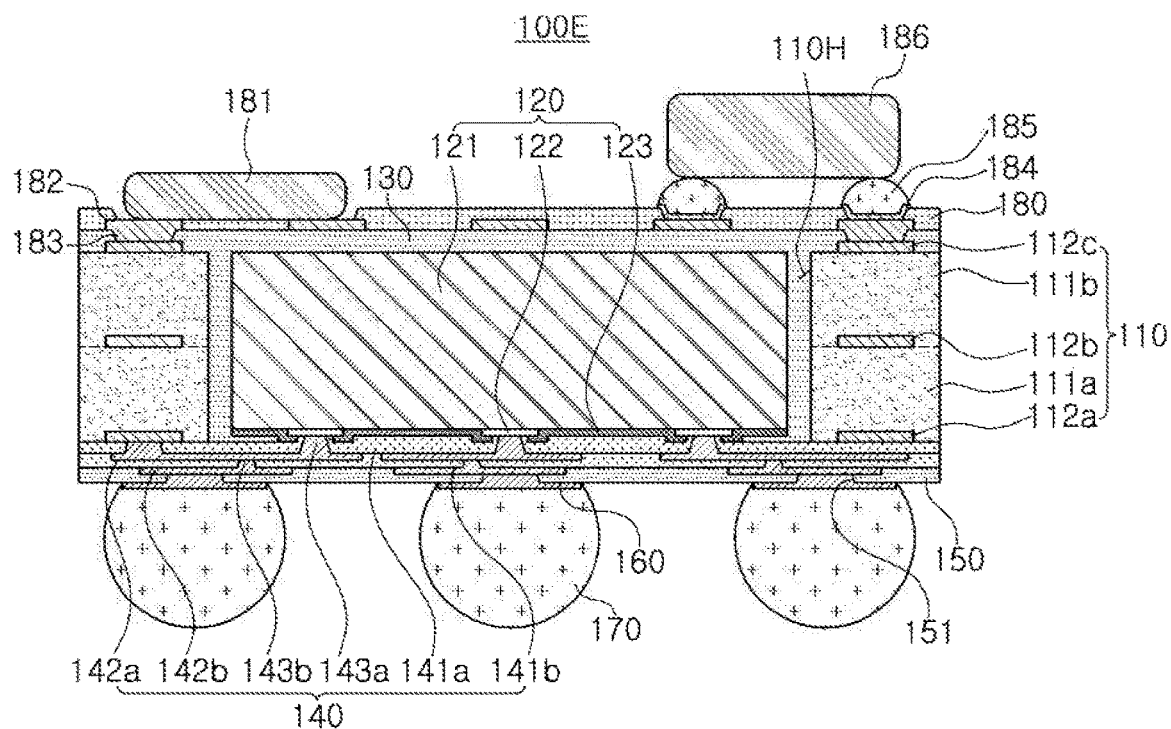
FIG. 19 is a cross-sectional diagram schematically illustrating a modified example of the fan-out semiconductor package of FIG. 9.

FIG. 19 is a cross-sectional diagram schematically illustrating a modified example of the fan-out semiconductor package of FIG. 9.

Referring to FIG. 19, in a fan-out semiconductor package 100E according to the modified example, a redistribution layer 182 electrically connected to the third redistribution layer 112c of the first connection member 110 through a via 183 penetrating through the encapsulant 130 may be disposed on the encapsulant 130. Further, a passivation layer 180 having an opening (not denoted by a reference numeral) partially exposing the redistribution layer 182 may be disposed on the encapsulant 130. Separate surface mounting components 181 and 186 may be disposed on the opening (not denoted by a reference numeral) to thereby be electrically connected to the redistribution layer 182. The surface mounting components 181 and 186 may be directly connected to the redistribution layer 182 or be connected to the redistribution layer 182 through soldering (not illustrated), or the like, depending on the kind of surface mounting components. Alternatively, the surface mounting components 181 and 186 may be connected to the redistribution layer 182 through an under-bump metallization layer 184 and a connection terminal 185. The surface mounting components 181 and 186 may be various kinds of passive components or various kinds of integrated circuits.

Since other configurations or a manufacturing method of the fan-out semiconductor package 100E are the same as those described in the fan-out semiconductor package 100A according to the example, descriptions thereof will be omitted.

Figure 20:
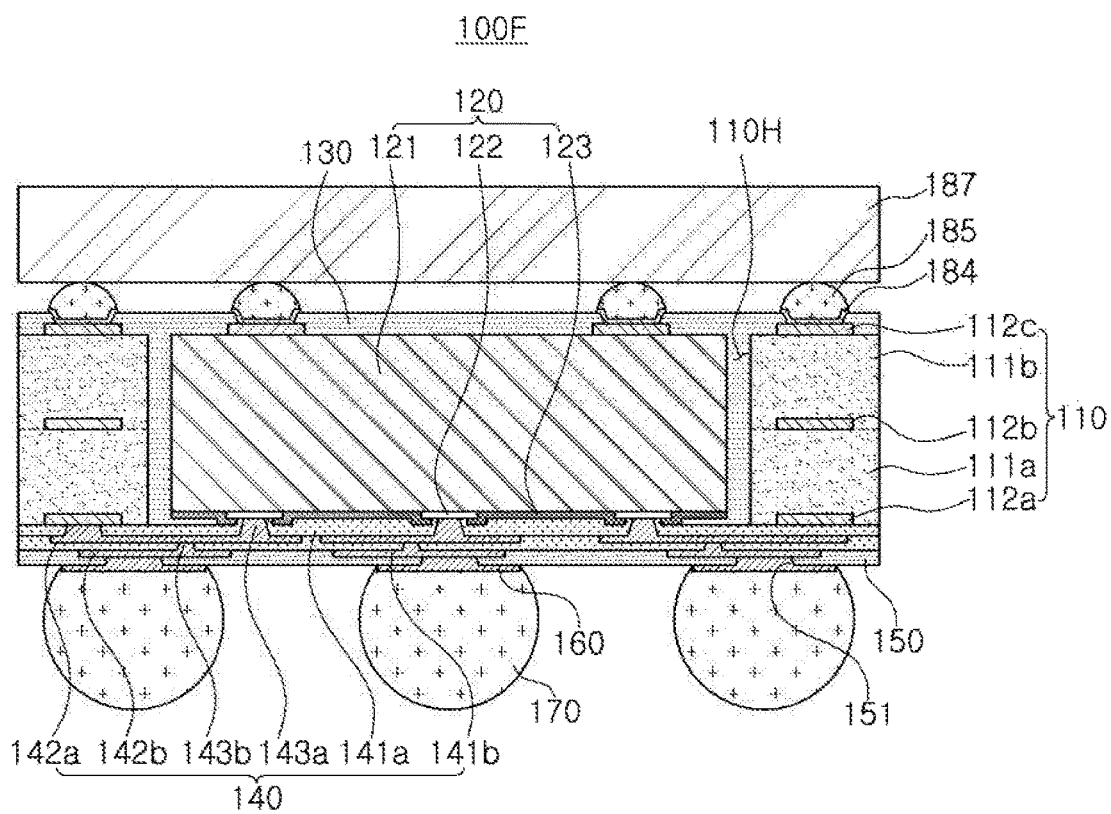
FIG. 20 is a cross-sectional diagram schematically illustrating a modified example of the fan-out semiconductor package of FIG. 9.

FIG. 20 is a cross-sectional diagram schematically illustrating a modified example of the fan-out semiconductor package of FIG. 9.

Referring to FIG. 20, in a fan-out semiconductor package 100F according to the modified example, a memory chip package 187 may be stacked on the encapsulant 130. The memory chip package 187 may be electrically connected to the third redistribution layer 112c of the first connection member 110 through an under-bump metallization layer 184 formed on the opening 131 of the encapsulant 130 partially exposing the third redistribution layer 112c of the first connection member 110 and a connection terminal 185 formed on the under-bump metallization layer 184. The memory chip package 187 may include a memory chip such as a volatile memory (for example, a dynamic random access memory (DRAM)), a non-volatile memory (for example, a read only memory (ROM)), a flash memory, or the like.

Since other configurations or a manufacturing method of the fan-out semiconductor package 100F are the same as those described in the fan-out semiconductor package 100A according to the example, descriptions thereof will be omitted.

Figure 21:
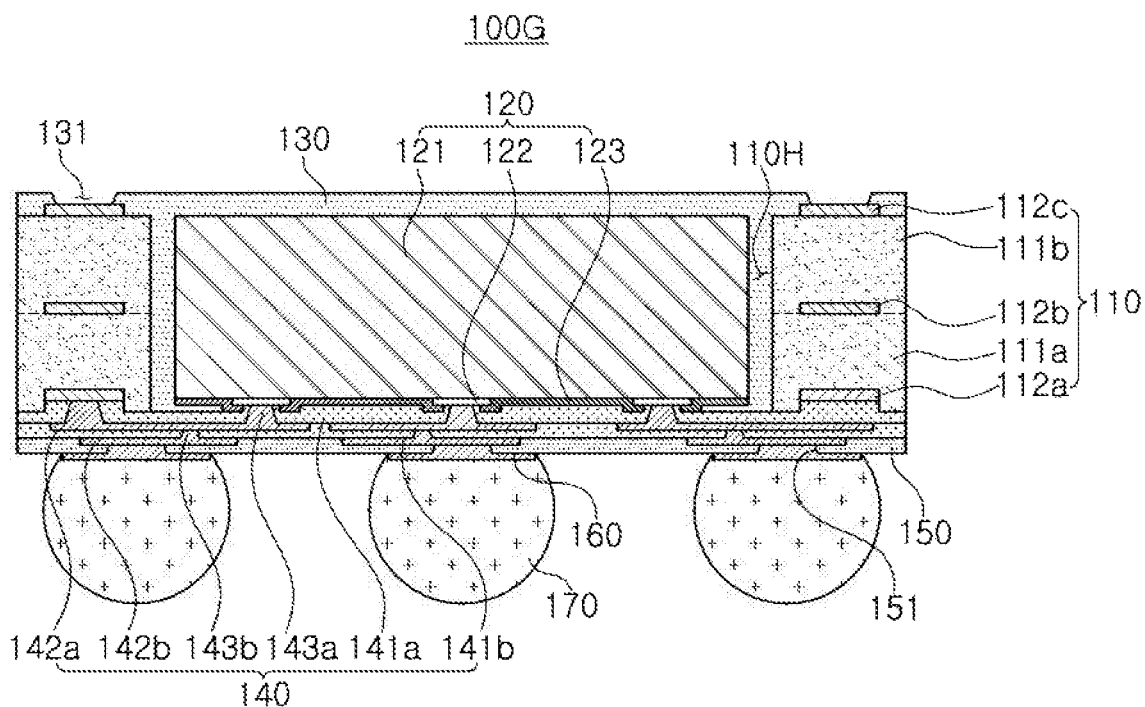
FIG. 21 is a cross-sectional diagram schematically illustrating a modified example of the fan-out semiconductor package of FIG. 9.

FIG. 21 is a cross-sectional diagram schematically illustrating a modified example of the fan-out semiconductor package of FIG. 9.

Referring to FIG. 21, in a fan-out semiconductor package 100G according to the modified example, the first redistribution layer 112a may be recessed in the first insulating layer, and thus a step portion may be formed between the lower surface of the first insulating layer 111a and a lower surface of the first redistribution layer 112a. As a result, contamination of the first redistribution layer 112a due to bleeding of a material for forming the encapsulant 130 at the time of forming the encapsulant 130 may be prevented. Meanwhile, since the first redistribution layer 112a is recessed in the first insulating layer 111a as described above, the lower surface of the first redistribution layer 112a of the first connection member 110 may be positioned to be higher than the lower surface of the connection pad 122 of the semiconductor chip 120. In addition, a distance between the redistribution layer 142a of the second connection member 140 and the first redistribution layer 112a of the first connection member 110 may be greater than a distance between the redistribution layer 142a of the second connection member 140 and the connection pad 122 of the semiconductor chip 120.

Since other configurations or a manufacturing method of the fan-out semiconductor package 100G are the same as those described in the fan-out semiconductor package 100A according to the example, descriptions thereof will be omitted.

Figure 22:
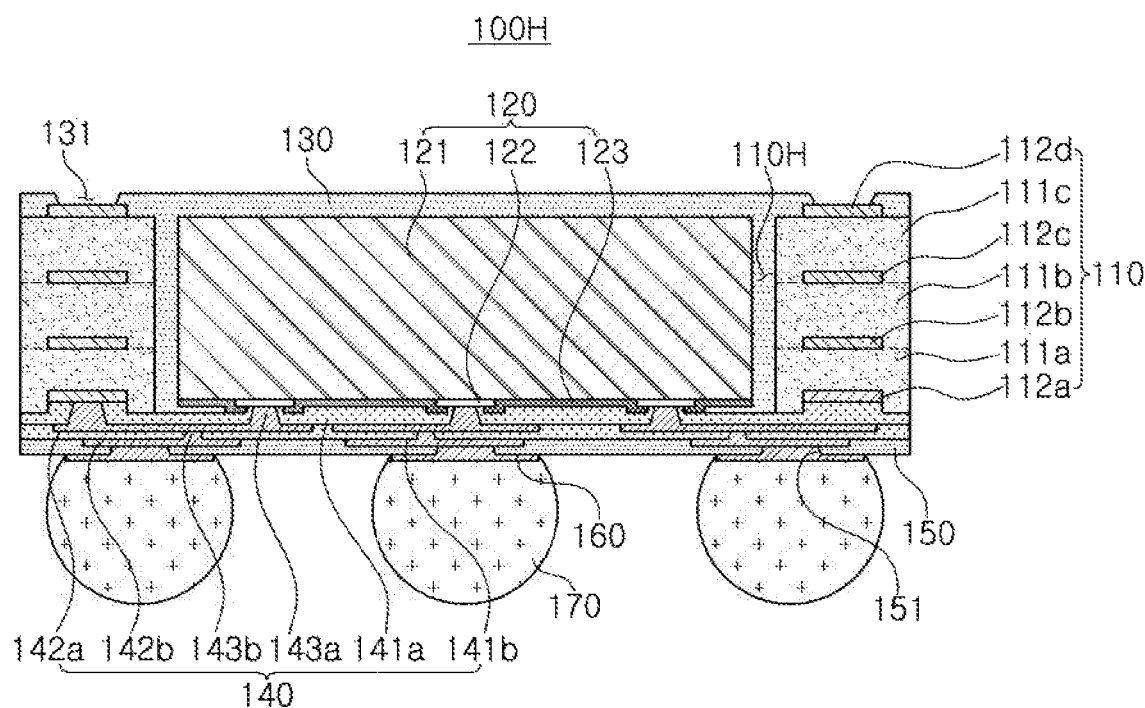
FIG. 22 is a cross-sectional diagram schematically illustrating a modified example of the fan-out semiconductor package of FIG. 9.

FIG. 22 is a cross-sectional diagram schematically illustrating a modified example of the fan-out semiconductor package of FIG. 9.

Referring to FIG. 22, in a fan-out semiconductor package 100H according to the modified example, the first connection member 110 may further include a third insulating layer 111c disposed on the second insulating layer 111b and covering the third redistribution layer 112c and a fourth redistribution layer 112d disposed on the third insulating layer 111c. That is, the first connection member 110 may include a larger number of redistribution layers 112a, 112b, 112c, and 112d. As a result, the number of layers of the second connection member 140 may be further decreased, and thus, a process yield, and the like, may be further improved as described above.

Since other configurations or a manufacturing method of the fan-out semiconductor package 100H are the same as those described in the fan-out semiconductor package 100A according to the example, descriptions thereof will be omitted.

Figure 23:
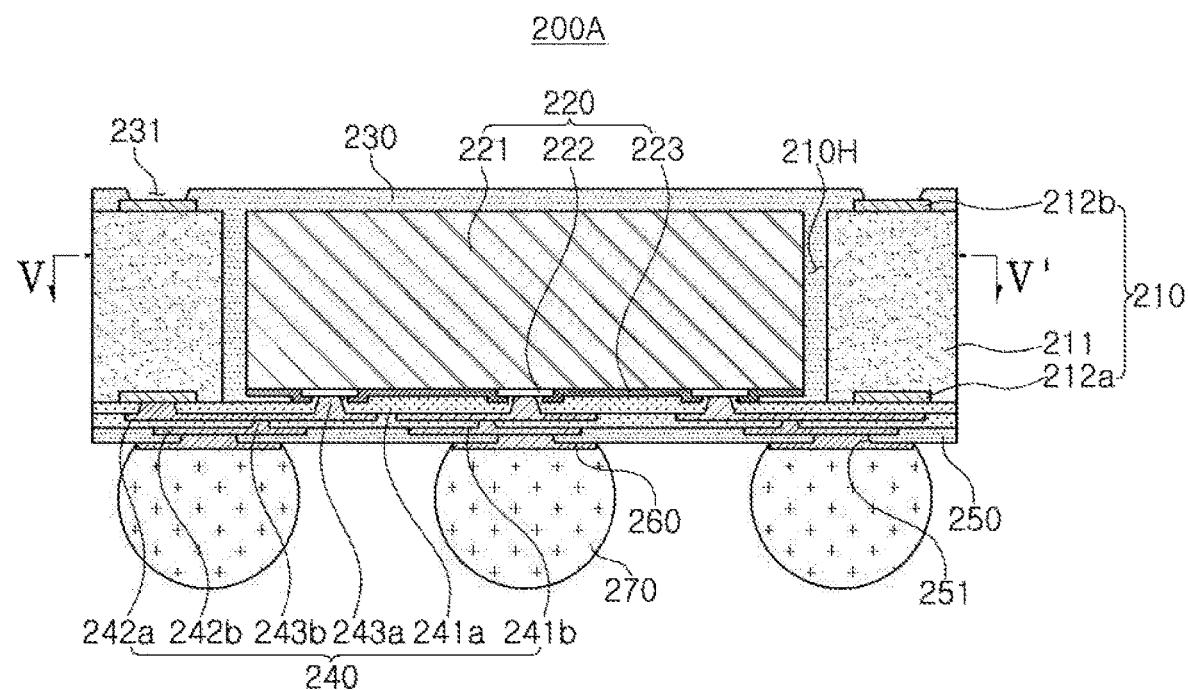
FIG. 23 is a cross-sectional diagram schematically illustrating another example of the fan-out semiconductor package.

FIG. 23 is a cross-sectional diagram schematically illustrating another example of the fan-out semiconductor package.

Figure 24:
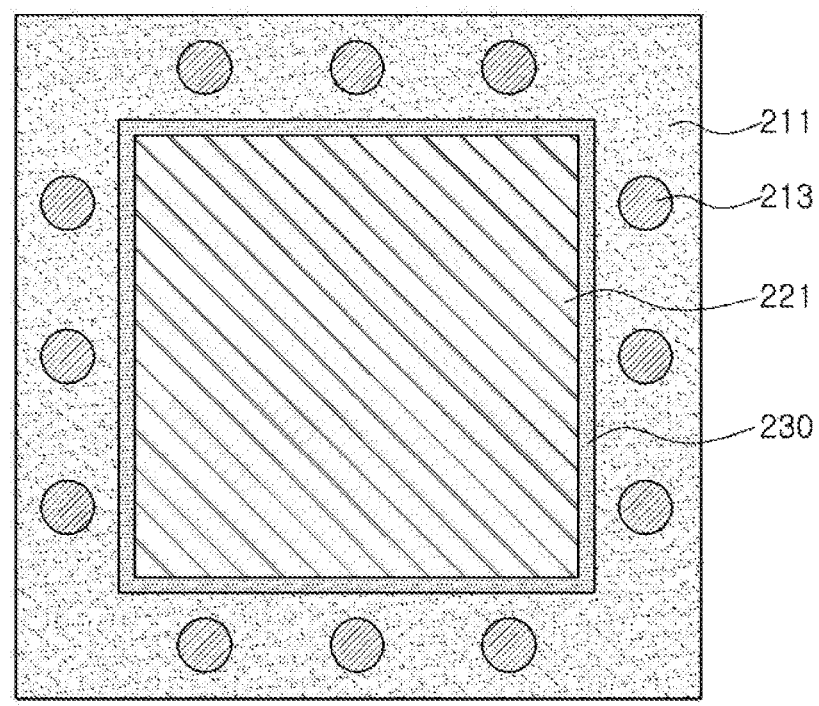
FIG. 24 is a cut-away plan diagram of the fan-out semiconductor package taken along line V-V' of FIG. 23.
Figure 25A:
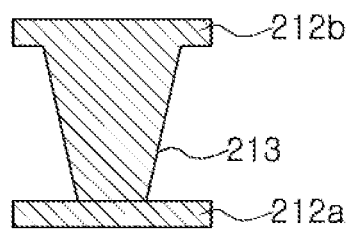
FIGS. 25A through 25D are cross-sectional diagrams schematically illustrating various shapes of a via formed in a first connection member of the fan-out semiconductor package of FIG. 23.
Figure 25B:
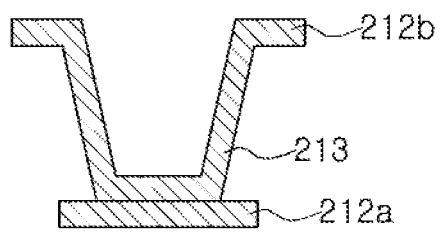
Figure 25C:
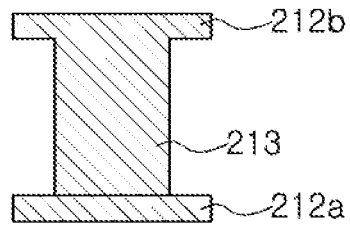
Figure 25D:
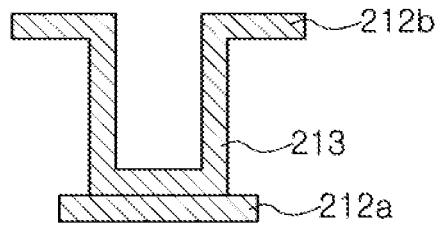

FIG. 24 is a cut-away plan diagram of the fan-out semiconductor package taken along line V-V' of FIG. 23.

Referring to FIGS. 23 and 24, a fan-out semiconductor package 200A according to another example may include a first connection member 210 having a through hole 210H; a semiconductor chip 220 disposed in the through hole 210H of the first connection member 210 and having an active surface on which a connection pad 222 is disposed and a non-active surface opposing the active surface; an encapsulant 230 at least partially encapsulating the first connection member 210 and the non-active surface of the semiconductor chip 220; and a second connection member 240 disposed on the first connection member 210 and the active surface of the semiconductor chip 220 and including redistribution layers 242a and 242b electrically connected to the connection pad 222. The first connection member 210 may include an insulating layer 211 contacting the second connection member 240, a first redistribution layer 212a embedded in the insulating layer 211 while contacting the second connection member 240, and a second redistribution layer 212b disposed on the other side of the insulating layer 211 opposing one side of the insulating layer 211 in which the first redistribution layer 212a is embedded. The first connection member 210 may include a via 213 electrically connecting the first and second redistribution layers 212a and 212b while penetrating through the insulating layer 211.

The first and second redistribution layers 212a and 212b may be electrically connected to the connection pad 222. The fan-out semiconductor package 200A according to another example may further include a passivation layer 250 disposed on the second connection member 240, an under-bump metallization layer 260 disposed on an opening 251 of the passivation layer 250, and a connection terminal 270 disposed on the under-bump metallization layer 260.

As in the fan-out semiconductor package 200A according to another example, in a case in which the first redistribution layer 212a of the first connection member 210 contacting the second connection member 240 is embedded in the insulating layer 211, a step portion generated due to a thickness of the first redistribution layer 212a may be significantly decreased, such that an insulating distance of the second connection member 240 may be constant. That is, a difference between a distance from the redistribution layer 242a of the second connection member 240 to a lower surface of the insulating layer 211 and a distance from the redistribution layer 242a of the second connection member 240 to the connection pad 222 may be less than the thickness of the first redistribution layer 212a. Therefore, it may be easy to design a high-density wiring of the second connection member 240.

Hereinafter, each of the configurations included in the fan-out semiconductor package 200A according to another example will be described in more detail.

The first connection member 210 may include the redistribution layers 212a and 212b redistributing the connection pad 222 of the semiconductor chip 220, thereby decreasing the number of layers of the second connection member 240. If necessary, the first connection member 210 may maintain rigidity of the package 200A depending on a specific material, and serve to secure thickness uniformity of the encapsulant 230, or the like. The first connection member 210 may have the through hole 210H. The semiconductor chip 220 may be disposed in the through hole 210H to be spaced apart from the first connection member 210 by a predetermined distance. The side surfaces of the semiconductor chip 220 may be surrounded by the first connection member 210. However, this is only an example, and a disposition form of the first connection member 210 may be variously changed, and the first connection member 210 may perform a different function depending on the disposition form.

A material of the insulating layer 211 is not particularly limited. For example, an insulating material may be used. Here, as the insulating material, a thermosetting resin such as an epoxy resin, a thermoplastic resin such as a polyimide, or a resin in which these resins are impregnated into a core material, such as a glass cloth, glass fabric, or the like, together with an inorganic filler, for example, a prepreg, an Ajinomoto build-up film (ABF), FR-4, a bismaleimide triazine (BT) resin, or the like, may be used. If necessary, a photoimagable dielectric (PID) resin may also be used.

The redistribution layers 212a and 212b may serve to redistribute the connection pad 222 of the semiconductor chip 220, and as a material for forming the redistribution layers 212a and 212b, a conductive material such as copper (Cu), aluminum (Al), silver (Ag), tin (Sn), gold (Au), nickel (Ni), lead (Pb), titanium (Ti), alloys thereof, or the like, may be used. The redistribution layers 212a and 212b may perform various functions depending on a design of the corresponding layer. For example, the redistribution layers 212a and 212b may include a ground (GND) pattern, a power (PWR) pattern, a signal (S) pattern, or the like. Here, the S pattern may include various signal patterns, for example, a data signal pattern, or the like, except for the GND pattern, the PWR pattern, and the like. In addition, the redistribution layers 212a and 212b may include a via pad, a connection terminal pad, or the like. As a non-restrictive example, both of the redistribution layers 212a and 212b may include the GND pattern. In this case, formation of a GND pattern on the redistribution layers 242a and 242b of the second connection member 240 may be significantly decreased, such that a degree of freedom in designing a wiring may be improved.

If necessary, a surface treatment layer (not illustrated) may be further formed on the redistribution layer 212b exposed through an opening 231 formed in the encapsulant 230, among the redistribution layers 212a and 212b. The surface treatment layer (not illustrated) is not particularly limited as long as it is known in the art. For example, the surface treatment layer may be formed by electrolytic gold plating, electroless gold plating, an organic solderability preservative (OSP) surface treatment or electroless tinplating, electroless silver plating, electroless nickel plating/immersion gold plating, direct immersion gold (DIG) plating, hot air solder leveling (HASL), or the like.

The via 213 may electrically connect the redistribution layers 212a and 212b formed on different layers to each other, thereby forming an electrical path in the first connection member 210. As a material for forming the via 213, a conductive material may also be used. As illustrated in FIGS. 25A through 25D, the via 213 may be completely filled with the conductive material, or be formed by forming the conductive material on a wall surface of a via hole. Further, the via 213 may have all shapes known in the art such as a cylindrical shape, and the like, in addition to a tapered shape. Meanwhile, as known through a process to be described below, when a hole for the via 213 is formed, some pads of the first redistribution layer 212a may serve as a stopper. Therefore, the via 213 has a tapered shape of which a width of an upper surface is wider than that of a lower surface, which may be advantageous in terms of the process. In this case, the via 213 may be integrated with a portion of the second redistribution layer 212b.

The semiconductor chip 220 may be an integrated circuit (IC) indicating a chip in which at least hundreds to millions or more of various elements are integrated. The integrated circuit may be, for example, an application process chip such as a central processor (for example, a central processing unit (CPU)), a graphics processor (for example, a graphics processing unit (GPU)), a digital signal processor, a cryptographic processor, a microprocessor, a microcontroller, or the like, but is not limited thereto. The semiconductor chip 220 may be formed, for example, based on an active wafer. In this case, as a base material of a body 221, silicon (Si), germanium (Ge), gallium arsenide (GaAs), or the like, may be used. Various circuits may be formed in the body 221. The connection pad 222 may be configured for electrically connecting the semiconductor chip 220 to another component. As a material for forming the connection pad 222, any conductive material such as aluminum (Al), or the like, may be used without particular limitation. A passivation film 223 exposing the connection pad 222 may be formed on the body 221. The passivation film 223 may be formed of an oxide film, a nitride film, or the like. Alternatively, the passivation film 223 may be formed of a double layer of an oxide film and a nitride film. A step portion may be formed between a lower surface of the connection pad 222 and a lower surface of the encapsulant 230 by the passivation film 223. As a result, bleeding of the encapsulant 230 into the lower surface of the connection pad 222 may be somewhat prevented. An insulating film (not illustrated), or the like, may be further disposed on any other required position.

The non-active surface of the semiconductor chip 220 may be positioned to be lower than an upper surface of the second redistribution layer 212b of the first connection member 210. For example, the non-active surface of the semiconductor chip 220 may be positioned to be lower than an upper surface of the insulating layer 211 of the first connection member 210. A height difference between the non-active surface of the semiconductor chip 220 and the upper surface of the second redistribution layer 212b of the first connection member 210 may be 2 µm or more, for example, 5 µm or more. In this case, cracks occurring in a corner portion of the non-active surface of the semiconductor chip 220 may be effectively prevented. Further, at the time of applying the encapsulant 230, a deviation in the insulating distance on the non-active surface of the semiconductor chip 220 may be significantly decreased.

The encapsulant 230 may protect the first connection member 210 and/or the semiconductor chip 220. A shape of the encapsulant 230 is not particularly limited as long as the encapsulant 230 at least partially encloses the first connection member 210 and/or the semiconductor chip 220. For example, the encapsulant 230 may cover the first connection member 210 and the non-active surface of the semiconductor chip 220, and fill a space between a wall surface of the through hole 210H and side surfaces of the semiconductor chip 220. Further, the encapsulant 230 may at least partially fill a space between the passivation film 223 of the semiconductor chip 220 and the second connection member 240. Meanwhile, the encapsulant 230 fills the through hole 210H, thereby serving to decrease buckling while serving as an adhesive, depending on a specific material of the encapsulant 230.

A specific material of the encapsulant 230 is not particularly limited. For example, as the material of the encapsulant 230, an insulating material may be used. Here, as the insulating material, a thermosetting resin such as an epoxy resin, a thermoplastic resin such as polyimide, or a resin in which a reinforcing material, such as an inorganic filler, is impregnated in the thermosetting resin and the thermoplastic resin, for example, ABF, FR-4, a BT resin, a PID resin, or the like, may be used. Further, a molding material known in the art such as an epoxy molding compound (EMC), or the like, may also be used. If necessary, a resin in which a thermosetting resin or thermoplastic resin is impregnated into a core material, such as a glass cloth, a glass fabric, or the like, together with an inorganic filler may also be used.

The encapsulant 230 may be composed of a plurality of layers formed of a plurality of materials. For example, a space in the through hole 210H may be filled with a first encapsulant, and then, the first connection member 210 and the semiconductor chip 220 may be covered with a second encapsulant. Alternatively, after covering the first connection member 210 and the semiconductor chip 220 at a predetermined thickness while filling the space in the through hole 210H using the first encapsulant, the second encapsulant may be disposed on the first encapsulant again at a predetermined thickness. Besides, the encapsulant 230 may be applied in various forms.

If necessary, conductive particles may be contained in the encapsulant 230 for shielding electromagnetic waves. Any conductive particle may be used as long as it may shield the electromagnetic wave. For example, the conductive particle may be formed of copper (Cu), aluminum (Al), silver (Ag), tin (Sn), gold (Au), nickel (Ni), lead (Pb), titanium (Ti), solder, or the like. However, these materials are only examples, and the conductive particle is not particularly limited thereto.

The second connection member 240 may be configured for redistributing the connection pad 222 of the semiconductor chip 220. Several ten to several hundred connection pads 222 having various functions may be redistributed through the second connection member 240, and physically and/or electrically connected to the outside depending on the functions thereof through connection terminals 270 to be described below. The second connection member 240 may include insulating layers 241a and 241b, redistribution layers 242a and 242b disposed on the insulating layers 241a and 241b, and vias 243a and 243b connecting the redistribution layers 242a and 242b to each other while penetrating through the insulating layers 241a and 241b. In the fan-out semiconductor package 200A according to another example, the second connection member 240 may be composed of a plurality of redistribution layers 242a and 242b. However, the second connection member 240 may also be composed of a single layer. In addition, the second connection member 240 may also have a different number of layers.

As a material of the insulating layers 241a and 241b, an insulating material may be used. In this case, as the insulating material, a photosensitive insulating material such as a photoimagable dielectric (PID) resin in addition to the above-mentioned insulating materials may also be used. In this case, the insulating layers 241a and 241b may be formed to be thinner, and fine pitches of the vias 243a and 243b may be more easily implemented. The insulating layers 241a and 241b may be formed of the same material as each other, or different materials from each other, if necessary. The insulating layers 241a and 241b may be integrated with each other depending on a process, such that a boundary therebetween may be obscure.

The redistribution layers 242a and 242b may serve to substantially redistribute the connection pad 222, and as a material for forming the redistribution layers 242a and 242b, a conductive material such as copper (Cu), aluminum (Al), silver (Ag), tin (Sn), gold (Au), nickel (Ni), lead (Pb), titanium (Ti), alloys thereof, or the like, may be used. The redistribution layers 242a and 242b may perform various functions depending on a design of the corresponding layer. For example, the redistribution layers 242a and 242b may include a ground (GND) pattern, a power (PWR) pattern, a signal (S) pattern, or the like. Here, the S pattern may include various signal patterns, for example, a data signal pattern, or the like, except for the GND pattern, the PWR pattern, and the like. In addition, the redistribution layers 242a and 242b may include a via pad, a connection terminal pad, or the like.

If necessary, a surface treatment layer (not illustrated) may be further formed on the redistribution layer 242b which is partially exposed, among the redistribution layers 242a and 242b. The surface treatment layer (not illustrated) is not particularly limited as long as it is known in the art. For example, the surface treatment layer may be formed by electrolytic gold plating, electroless gold plating, an organic solderability preservative (OSP) surface treatment or electroless tin plating, electroless silver plating, electroless nickel plating/immersion gold plating, direct immersion gold (DIG) plating, hot air solder leveling (HASL), or the like.

The vias 243a and 243b may electrically connect the redistribution layers 242a and 242b formed on different layers, the connection pad 222, and the like, to each other, thereby forming an electrical path in the package 200A. As a material for forming the vias 243a and 243b, a conductive material such as copper (Cu), aluminum (Al), silver (Ag), tin (Sn), gold (Au), nickel (Ni), lead (Pb), titanium (Ti), alloys thereof, or the like, may be used. The vias 243a and 243b may be completely filled with the conductive material, or the conductive material may also be formed on walls of the vias. Further, the vias 243a and 243b may have all shapes known in the art such as a tapered shape, a cylindrical shape, and the like.

A thickness of the redistribution layers 212a and 212b of the first connection member 210 may be thicker than that of the redistribution layers 242a and 242b of the second connection member 240. The first connection member 210 may have a thickness equal to or thicker than that of the semiconductor chip 220, and thus the redistribution layers 212a and 212b formed therein may also have a thick thickness in accordance with the thickness of the first connection member 210. On the contrary, the redistribution layers 242a and 242b of the second connection member 240 may be formed to be relatively thinner than that of the redistribution layers 212a and 212b of the first connection member 210 in order to thin the second connection member 240.

The passivation layer 250 may be additionally configured for protecting the second connection member 240 from external physical or chemical damages, or the like. The passivation layer 250 may have an opening 251 at least partially exposing the redistribution layer 242b among the redistribution layers 242a and 242b of the second connection member 240. The opening 251 may expose the entire one surface of the redistribution layer 242b or only a portion of one surface thereof. A material of the passivation layer 250 is not particularly limited. For example, a photosensitive insulating material such as a photosensitive insulating resin may be used. Alternatively, a solder resist may also be used as the material of the passivation layer 250. Alternatively, an insulating resin which does not contain a core material but contains a filler, for example, an Ajinomoto Build-up Film (ABF) containing an inorganic filler and an epoxy resin, or the like, may be used.

The under-bump metallization layer 260 may be additionally configured for improving connection reliability of the connection terminal 270 to improve board level reliability. The under-bump metallization layer 260 may be disposed on an inner wall surface of the opening 251 of the passivation layer 250 and the exposed redistribution layer 242b of the second connection member 240. The under-bump metallization layer 260 may be formed of a conductive material known in the art, that is, a metal using a metallization method known in the art.

The connection terminal 270 may be additionally configured for physically and/or electrically connecting the fan-out semiconductor package 200A to the outside. For example, the fan-out semiconductor package 200A may be mounted on a main board of an electronic device through the connection terminal 270. The connection terminal 270 may be formed of a conductive material, for example, solder, or the like. However, the material is only an example, and the material of the connection terminal is not particularly limited thereto. The connection terminal 270 may be a land, a ball, a pin, or the like. The connection terminal 270 may be formed of a multilayer or single layer. In a case in which the connection terminal 270 is formed of the multilayer, the connection terminal 270 may contain a copper pillar and solder, and in a case in which the connection terminal 270 is formed of the single layer, the connection terminal 270 may contain tin-silver solder or copper. However, these cases are only examples, and the connection terminal 270 is not limited thereto. The number, an interval, a disposition shape, and the like, of connection terminal 270 are not particularly limited, but may be sufficiently changed by a person skilled in the art depending on a design. For example, the number of connection terminal 270 may be several tens to several thousands depending on the number of connection pad 222 of the semiconductor chip 220. Alternatively, the number of connection terminal 270 may be more than or less than the above-mentioned range.

At least one of the connection terminals 270 may be disposed in a fan-out region. The fan-out region may mean a region deviated from a region in which the semiconductor chip 220 is disposed. That is, the semiconductor package 200A according to another example may be a fan-out package. In the case of the fan-out package, reliability may be more excellent as compared to a fan-in package, a plurality of I/O terminals may be implemented, and 3D interconnection may be easily performed. Further, since the fan-out package may be mounted on an electronic device without a separate board as compared to a ball grid array (BGA) package, a land grid array (LGA) package, or the like, the fan-out package may be manufactured to have a thin thickness, and price competitiveness may be excellent.

Although not illustrated, if necessary, a plurality of semiconductor chips (not illustrated) may be disposed in the through hole 210H of the first connection member 210. In addition, a plurality of through holes 210H (not illustrated) may be formed in the first connection member 210, and a semiconductor chip (not illustrated) may be disposed in each of the through holes. Further, a separate passive component (not illustrated), for example, a condenser, an inductor, or the like, in addition to the semiconductor chip may be encapsulated together with each other in the through hole 210H. In addition, a surface mounting component (not illustrated) may be mounted on the passivation layer 250.

FIGS. 26A through 26D illustrate an example of a schematic manufacturing process of the fan-out semiconductor package of FIG. 23.

Figure 26A:
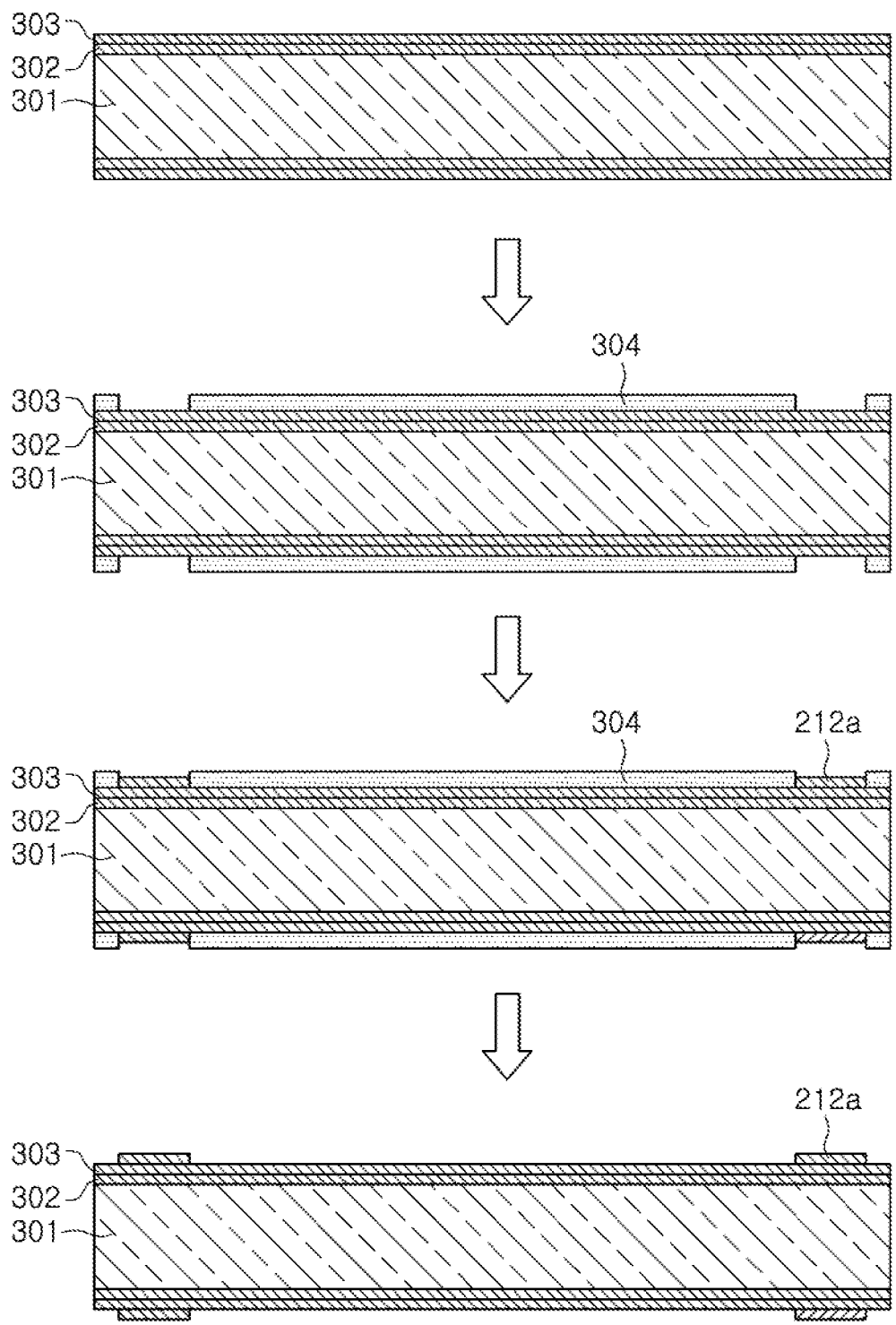
FIGS. 26A through 26D illustrate an example of a schematic manufacturing process of the fan-out semiconductor package of FIG. 23.

Referring to FIG. 26A, first, a carrier film 301 may be prepared. Metal films 302 and 303 may be formed on one surface or the both surfaces of the carrier film 301. An adhesive surface between the metal films 302 and 303 may be surface-treated so as to facilitate separation in a subsequent separation process. Alternatively, a release layer may be provided between the metal films 302 and 303, thereby facilitating separation in a subsequent process. The carrier film 301 may be an insulating substrate known in the art, and a material thereof is not limited. The metal films 302 and 303 may be generally formed of copper (Cu) foil, but are not limited thereto. The metal films 302 and 303 may also be thin films formed of another conductive material. Next, patterning for forming the first redistribution layer 212a may be performed using a dry film 304. The patterning may be performed using a photolithography method known in the art. The dry film 304 may be a dry film formed of a photosensitive material, known in the art. Then, the first redistribution layer 212a may be formed by filling a patterned space of the dry film 304 with a conductive material. In this case, a plating method may be used, and the metal film 303 may serve as a seed layer. The plating method may be an electrolytic plating method, an electroless plating method, or the like. In more detail, the first redistribution layer 212a may be formed using a chemical vapor deposition (CVD) method, a physical vapor deposition (PVD) method, a sputtering method, a subtractive method, an additive method, a semi-additive process (SAP), a modified semi-additive process (MSAP), or the like, but is not limited thereto. Next, the dry film 304 may be removed. The dry film 304 may be removed by a method known in the art, for example, an etching method, or the like.

Figure 26B:
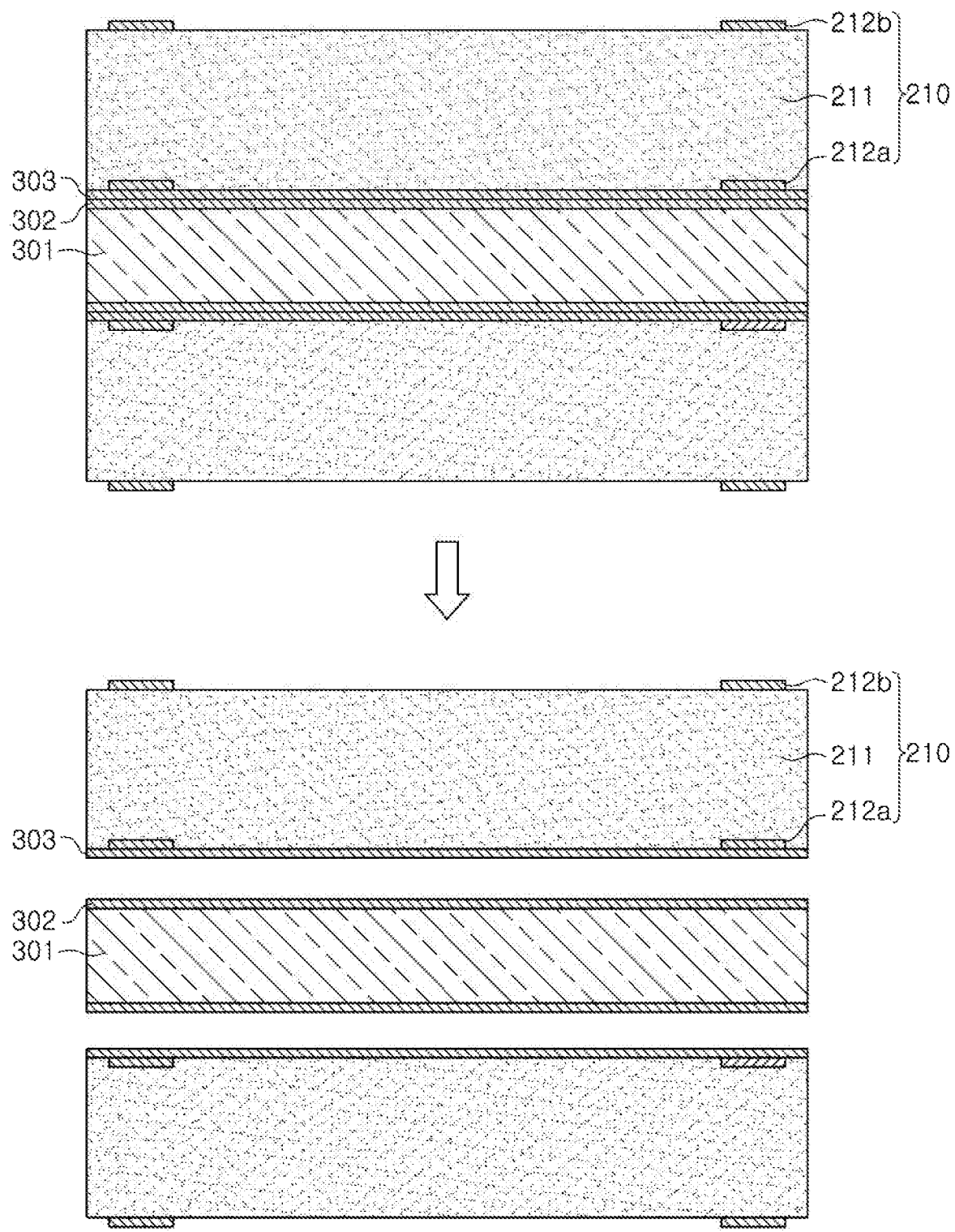

Referring to FIG. 26B, next, the insulating layer 211 in which the redistribution layer 212a is at least partially embedded may be formed on the metal film 303. Thereafter, the via 213 penetrating through the insulating layer 211 may be formed. In addition, the second redistribution layer 212b may be formed on the insulating layer 211. The insulating layer 211 may be formed by a method of laminating a precursor of the insulating layer 211 using a lamination method known in the art and curing the laminated precursor, or a method of applying a precursor material using an application method known in the art and curing the applied precursor material, or the like. The via 213 and the second redistribution layer 212b may be formed by a method of forming a via hole in the insulating layer 211 using a photolithography method, a mechanical drill, a laser drill, and/or the like, performing patterning using a dry film, or the like, and filling the via hole and the patterned space using a plating method, or the like. Next, the carrier film 301 may be delaminated. In this case, at the time of delamination, the metal films 302 and 303 may be separated from each other. In this case, the metal films 302 and 303 may be separated using a blade, but are not limited thereto. All of the methods known in the art may be used. Meanwhile, in a series of processes, a case in which the first connection member 210 is formed before delamination of the carrier film 301 is described, but the sequence is not limited thereto. That is, after delamination of the carrier film 301, the first connection member 210 may also be formed by the above-mentioned method. That is, the sequence is not necessarily limited to the above-mentioned sequence.

Figure 26C:
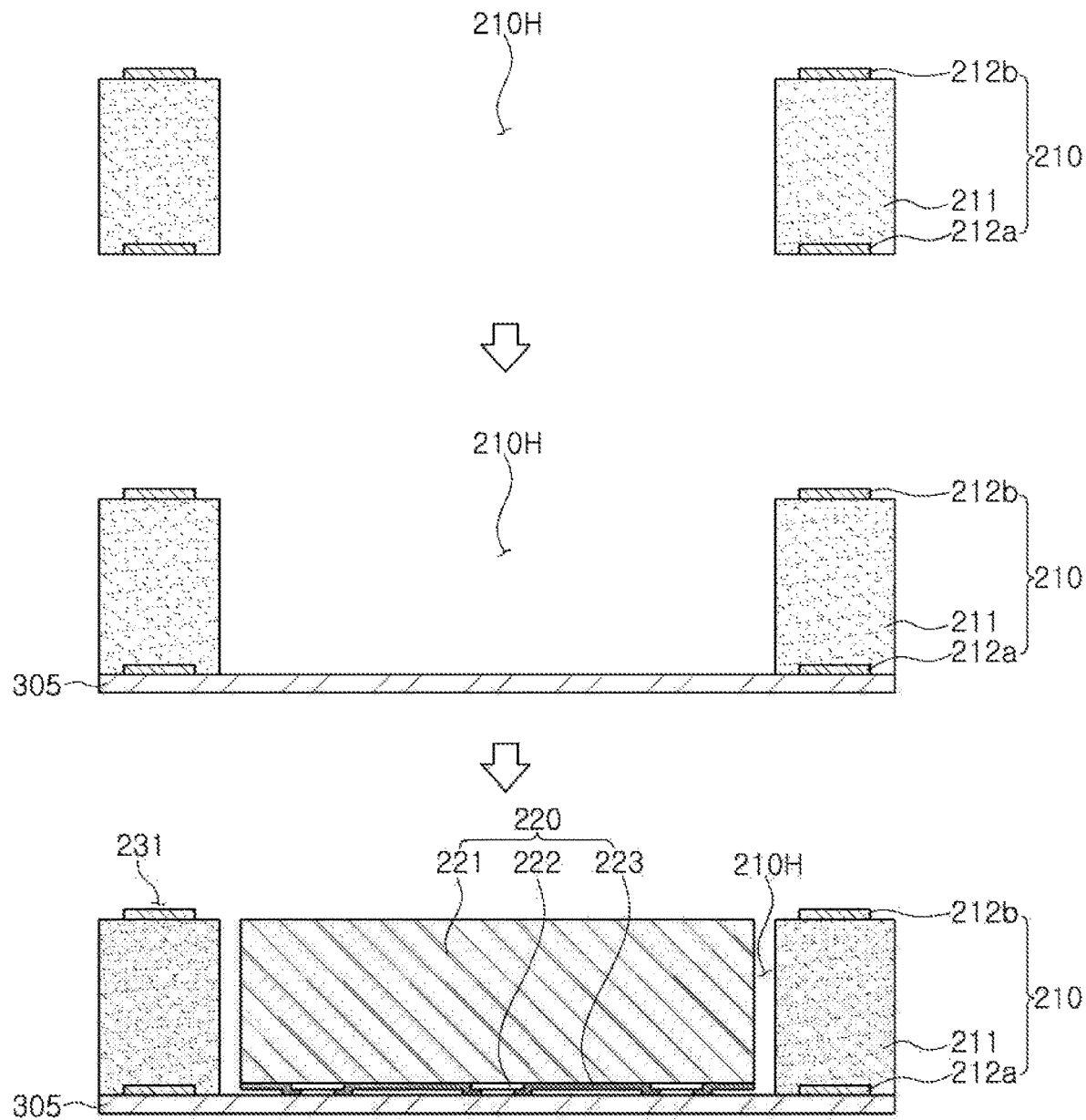

Referring to FIG. 26C, next, the remaining metal film 303 may be removed by an etching method known in the art, or the like, and the through hole 210H may be formed in the first connection member 210. The through hole 210H may be formed using a mechanical drilling process and/or a laser drilling process. However, the through hole 210H is not limited thereto, but may be formed by a sandblasting method using polishing particles, a dry etching method using plasma, or the like. In a case in which the through hole 210H is formed using the mechanical drilling process and/or the laser drilling process, a desmearing treatment such as a permanganate method, or the like, may be performed to remove resin smear in the through hole 210H. Further, an adhesive film 305 may be attached to one side of the first connection member 210. As the adhesive film 305, any adhesive film may be used as long as it may fix the first connection member 210. As a non-restrictive example, a tape known in the art, or the like, may be used. Examples of the tape known in the art may include a thermosetting adhesive tape of which adhesive force is decreased by heat treatment, a UV curable adhesive tape of which adhesive force is deteriorated by UV irradiation, and the like. Next, the semiconductor chip 220 may be disposed in the through hole 210H of the first connection member 210. For example, the semiconductor chip 220 may be disposed in the through hole 210H by adhering the semiconductor chip 220 onto the adhesive film 305 in the through hole 210. The semiconductor chip 220 may be disposed in a face down form so that the connection pad 222 is adhered to the adhesive film 305.

Figure 26D:
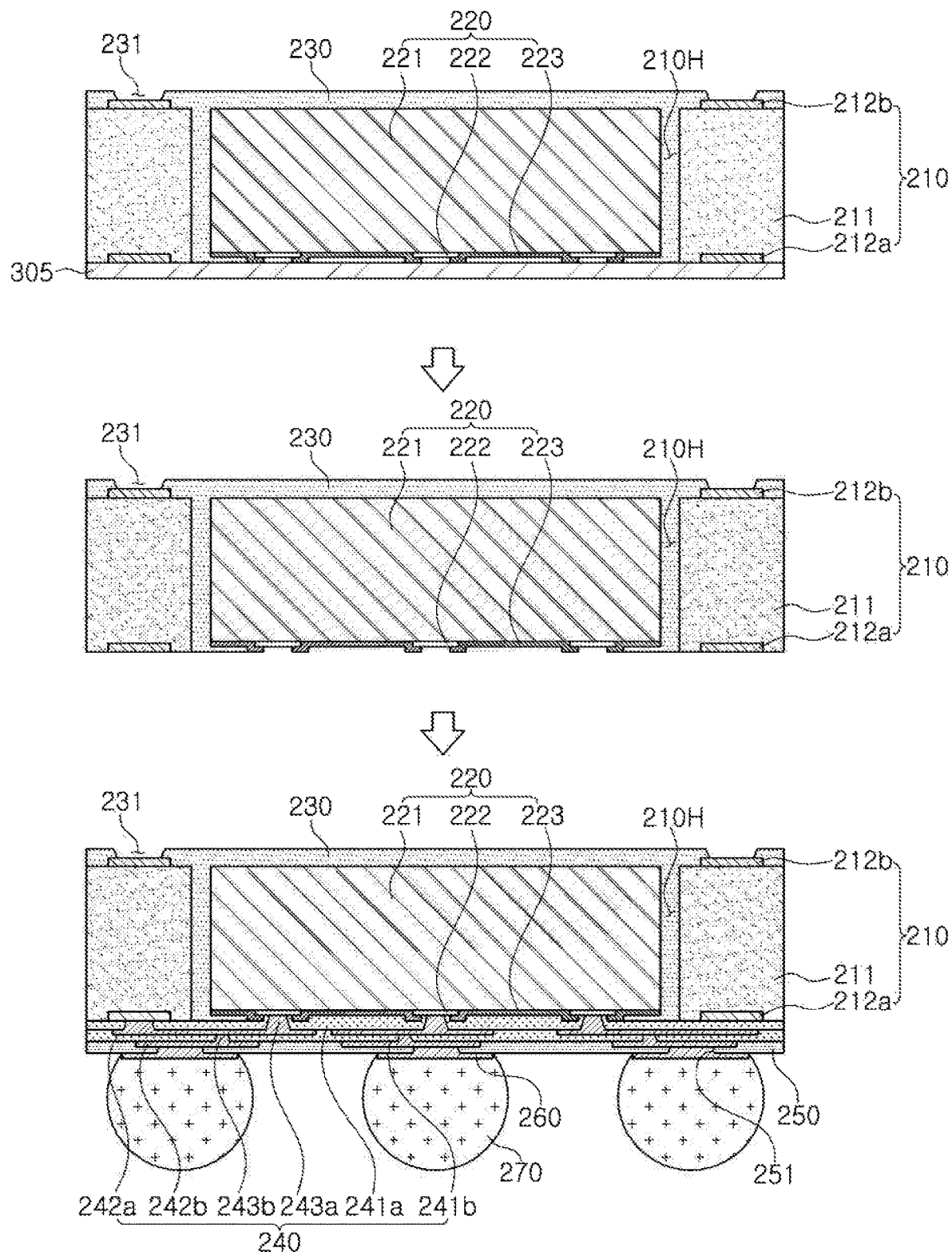

Referring to FIG. 26D, next, the semiconductor chip 220 may be encapsulated using the encapsulant 230. The encapsulant 230 may fill a space in the through hole 210H while at least encapsulating the first connection member 210 and the non-active surface of the semiconductor chip 220. The encapsulant 230 may be formed by a method known in the art. For example, the encapsulant 230 may be formed by laminating a precursor of the encapsulant 230 and curing the laminated precursor. Alternatively, the encapsulant 230 may be applied so as to encapsulate the semiconductor chip 220 on the adhesive film 305 and then cured. The semiconductor chip 220 may be fixed by curing. As the method of laminating the precursor, for example, a method of performing a hot press method of pressing the precursor at a high temperature for a predetermined time, decompressing the precursor, and then cooling the precursor to a room temperature, cooling the precursor in a cold press process, and then separating a work tool, or the like, may be used. As an application method, for example, a screen printing method of applying ink using a squeegee, a spray printing method of misting ink to apply the ink, or the like, may be used. Then, the adhesive film 305 may be delaminated. A delamination method is not particularly limited, but a method known in the art may be used. For example, in a case in which the thermosetting adhesive tape of which adhesive force is deteriorated by heat treatment or the UV curable adhesive tape of which adhesive force is deteriorated by UV irradiation is used as the adhesive film 305, the adhesive film 305 may be delaminated after deteriorating adhesive force by performing a heat treatment or UV irradiation on the adhesive film 305. Next, the second connection member 240 may be formed on the first connection member 210 and the active surface of the semiconductor chip 220 from which the adhesive film 305 is removed. The second connection member 240 may be formed by sequentially forming the insulating layers 241a and 241b, and forming the redistribution layers 241a and 242b and the vias 243a and 243b in the corresponding layers after forming the insulating layers 241a and 241b, respectively. If necessary, the passivation layer 250 may be formed on the second connection member 240. Similarly, the passivation layer 250 may be formed by a method of laminating a precursor of the passivation layer 250 and curing the laminated precursor, a method of applying a material for forming the passivation layer 250 and curing the applied material, or the like. The opening (251) may be formed in the passivation layer 250 so that the redistribution layer 242b of the second connection member 240 may be at least partially exposed, and the under-bump metallization layer 260 may also be formed thereon by a metallization method known in the art. If necessary, the connection terminal 270 may be formed on the under-bump metallization layer 260. A method of forming the connection terminal 270 is not particularly limited, but the connection terminal 270 may be formed by a method well-known in the art depending on a structure or shape thereof. The connection terminal 270 may be fixed by reflow, and reliability may be improved by embedding a portion of the connection terminal 270 in the passivation layer 250 and exposing the other portion thereof to the outside in order to increase fixation force.

Meanwhile, in order to facilitate mass production, in a series of processes, after the carrier film 301 having a large size is prepared, a plurality of fan-out semiconductor packages 200A may be manufactured through the process as described above. Then, the plurality of the fan-out semiconductor packages 200A may be singulated into individual unit fan-out semiconductor packages 200A by cutting. In this case, productivity may be excellent.

Figure 27:
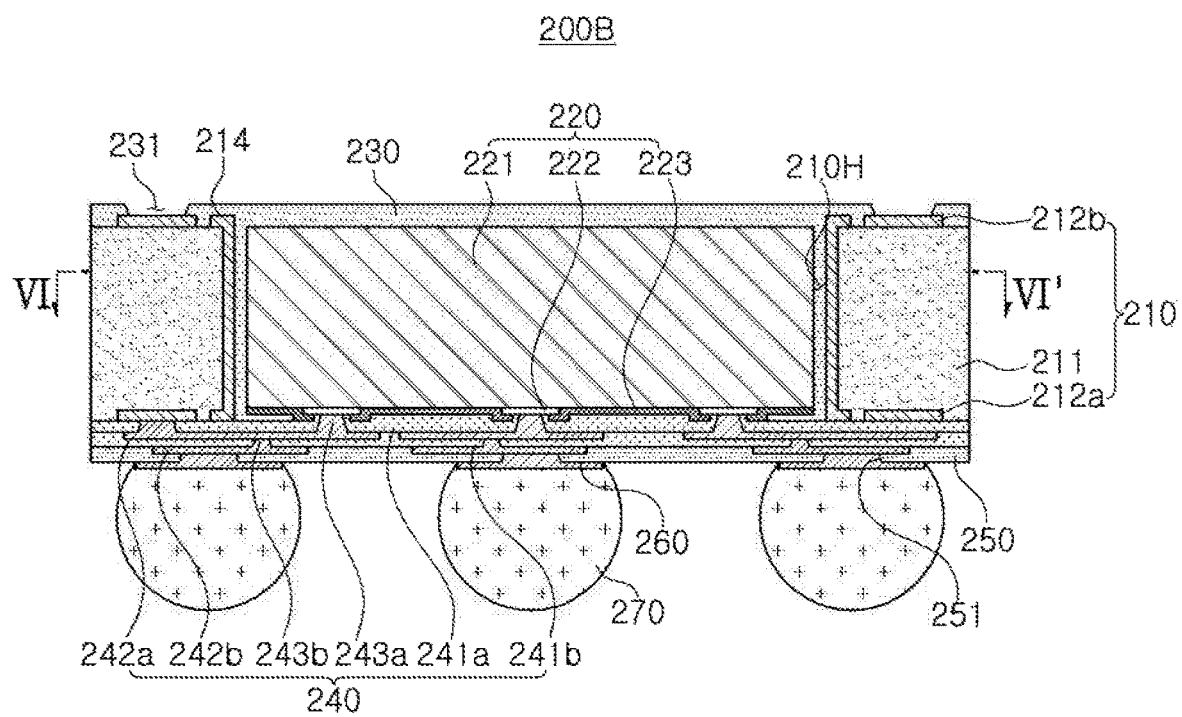
FIG. 27 is a cross-sectional diagram schematically illustrating a modified example of the fan-out semiconductor package of FIG. 23.

FIG. 27 is a cross-sectional diagram schematically illustrating a modified example of the fan-out semiconductor package of FIG. 23.

Figure 28:
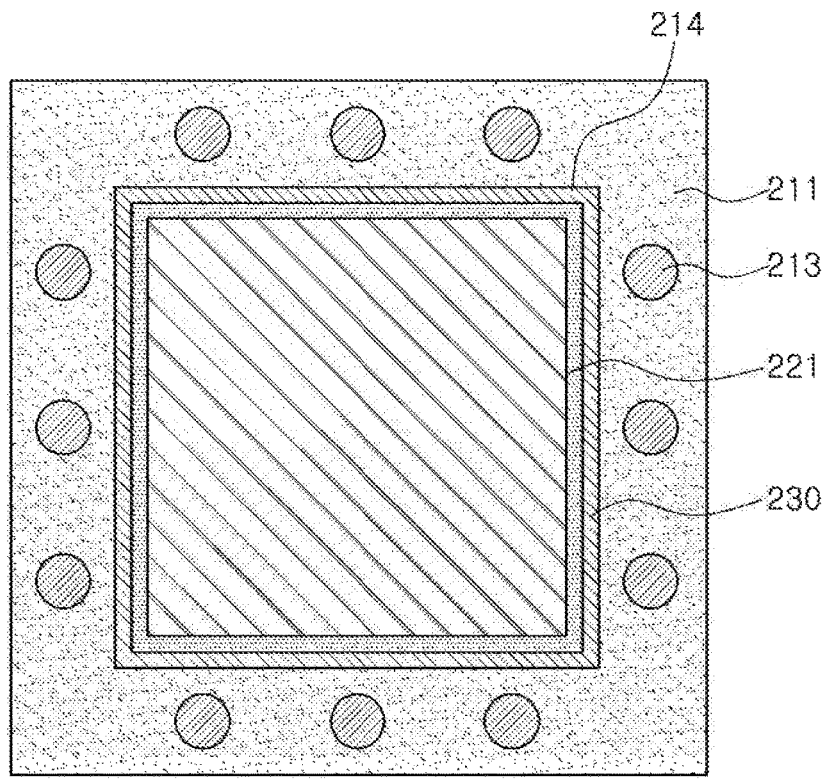
FIG. 28 is a cut-away plan diagram of the fan-out semiconductor package taken along line VI-VI' of FIG. 27.

FIG. 28 is a cut-away plan diagram of the fan-out semiconductor package taken along line VI-VI' of FIG. 27.

Referring to FIGS. 27 and 28, a fan-out semiconductor package 200B according to the modified example, a metal layer 214 may be disposed on an inner wall surface of the through hole 210H of the first connection member 210. The metal layer 214 may serve to effectively disperse heat generated in the semiconductor chip 220. Further, the metal layer 214 may also serve to shield electromagnetic waves. Further, the metal layer 214 may be connected to the ground patterns of other redistribution layers 212a and 212b of the first connection member 210 to thereby be utilized as a ground. The metal layer 214 may be disposed on the entire wall surface, or patterned in a specific shape to thereby be disposed. The metal layer 214 may contain the conductive material as described above, that is, a metal material.

Since other configurations or a manufacturing method of the fan-out semiconductor package 200B are the same as those described in the fan-out semiconductor package 200A according to another example, descriptions thereof will be omitted.

Figure 29:
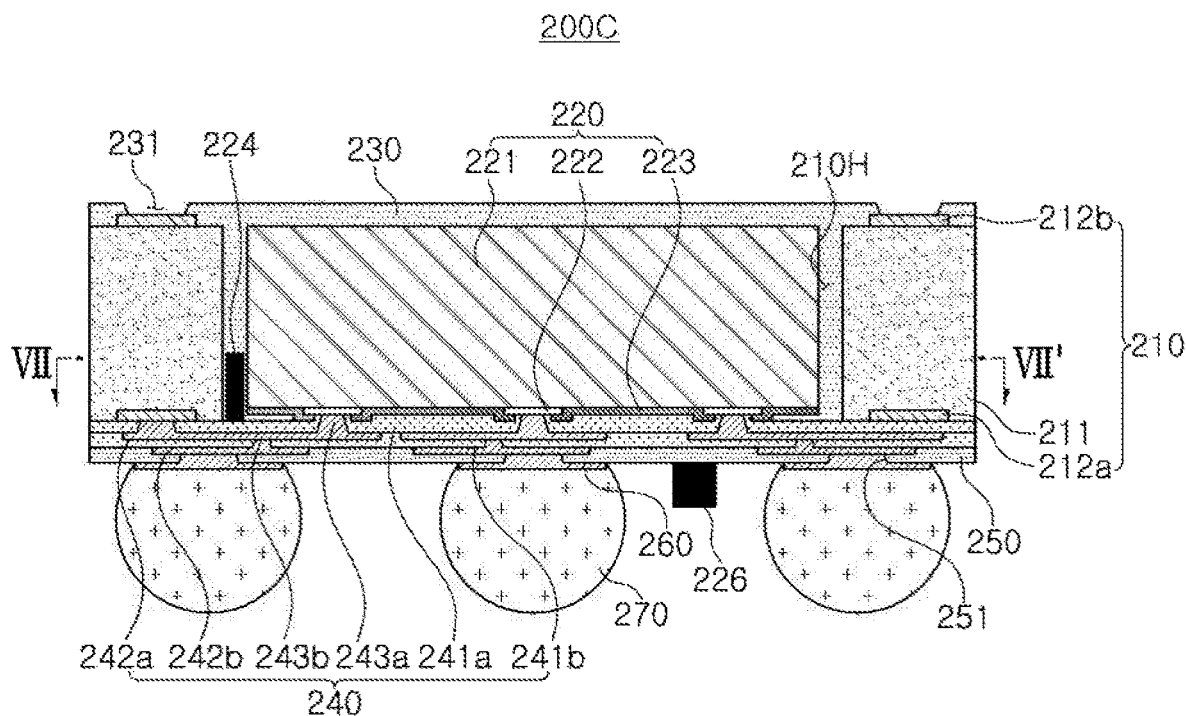
FIG. 29 is a cross-sectional diagram schematically illustrating a modified example of the fan-out semiconductor package of FIG. 23.

FIG. 29 is a cross-sectional diagram schematically illustrating a modified example of the fan-out semiconductor package of FIG. 23.

Figure 30:
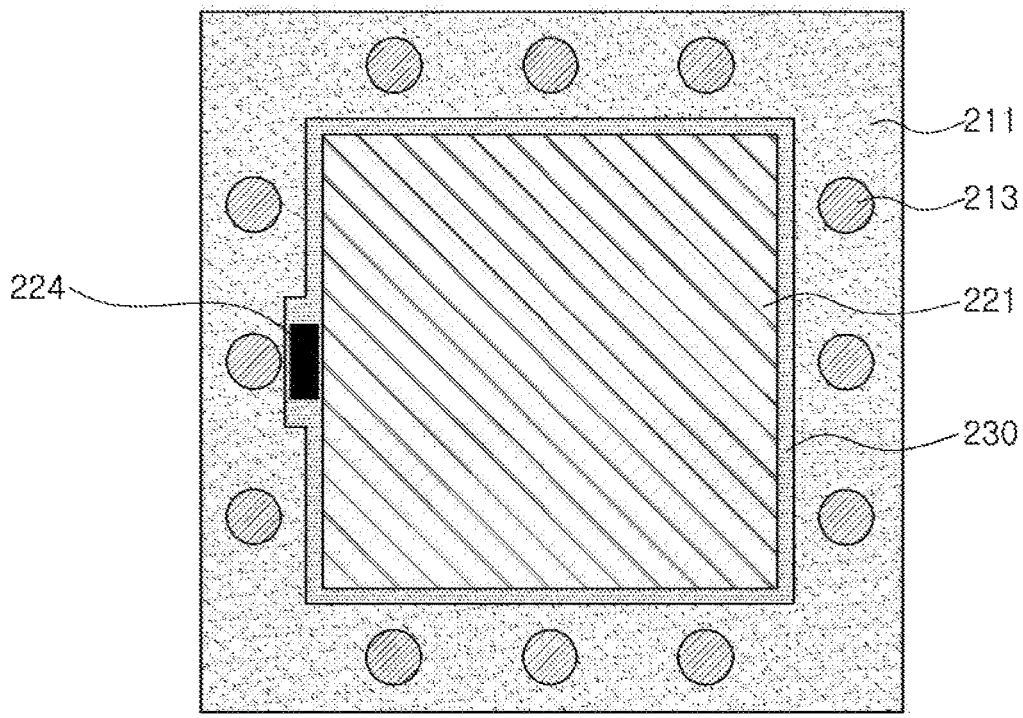
FIG. 30 is a cut-away plan diagram of the fan-out semiconductor package taken along line VII-VII' of FIG. 29.

FIG. 30 is a cut-away plan diagram of the fan-out semiconductor package taken along line VII-VII' of FIG. 29.

Referring to FIGS. 29 and 30, in a fan-out semiconductor package 200C according to the modified example, a separate first passive component 224 may be disposed in the through hole 210H. Further, a separate second passive component 226 may be disposed on a surface of the passivation layer 250. The first passive component 224 may be a high-capacitance capacitor, for example, a multilayer ceramic capacitor (MLCC), but is not limited thereto. The second passive component 226 may be a low-capacitance capacitor, for example, a Si based capacitor, but is not limited thereto. The first and second passive components 224 and 226 may be connected to the same power line to thereby be electrically connected to the semiconductor chip 220 through the power line, such that power supply efficiency may be improved.

Since other configurations or a manufacturing method of the fan-out semiconductor package 200C are the same as those described in the fan-out semiconductor package 200A according to another example, descriptions thereof will be omitted.

Figure 31:
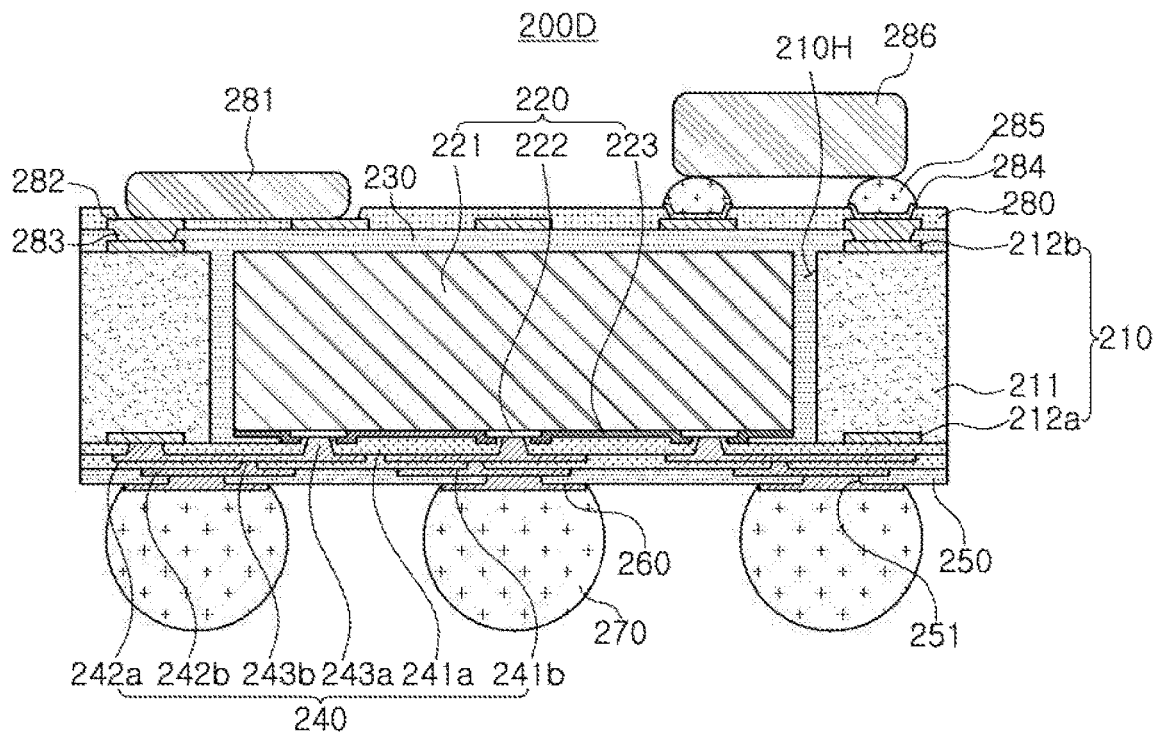
FIG. 31 is a cross-sectional diagram schematically illustrating a modified example of the fan-out semiconductor package of FIG. 23.

FIG. 31 is a cross-sectional diagram schematically illustrating a modified example of the fan-out semiconductor package of FIG. 23.

Referring to FIG. 31, in a fan-out semiconductor package 200D according to the modified example, a redistribution layer 282 electrically connected to the second redistribution layer 212b of the first connection member 210 through a via 283 penetrating through the encapsulant 230 may be disposed on the encapsulant 230. Further, a passivation layer 280 having an opening (not denoted by a reference numeral) partially exposing the redistribution layer 282 may be disposed on the encapsulant 230. Separate surface mounting components 281 and 286 may be disposed on the opening (not denoted by a reference numeral) to thereby be electrically connected to the redistribution layer 282. The surface mounting components 281 and 286 may be directly connected to the redistribution layer 282 or be connected to the redistribution layer 282 through soldering (not illustrated), or the like, depending on the kind of surface mounting components. Alternatively, the surface mounting components 281 and 286 may be connected to the redistribution layer 282 through an under-bump metallization layer 284 and a connection terminal 285. The surface mounting components 281 and 286 may be various kinds of passive components or various kinds of integrated circuits.

Since other configurations or a manufacturing method of the fan-out semiconductor package 200D are the same as those described in the fan-out semiconductor package 200A according to another example, descriptions thereof will be omitted.

Figure 32:
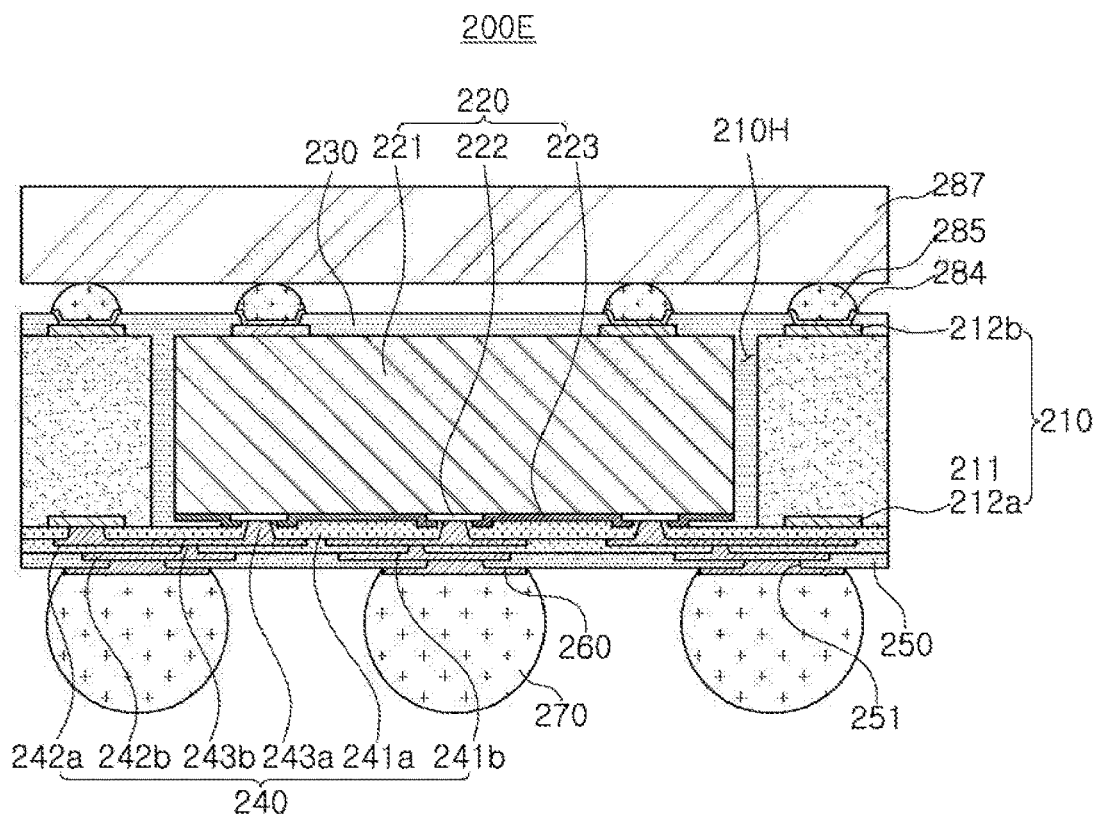
FIG. 32 is a cross-sectional diagram schematically illustrating a modified example of the fan-out semiconductor package of FIG. 23.

FIG. 32 is a cross-sectional diagram schematically illustrating a modified example of the fan-out semiconductor package of FIG. 23.

Referring to FIG. 32, in a fan-out semiconductor package 200E according to the modified example, a memory chip package 287 may be stacked on the encapsulant 230. The memory chip package 287 may be electrically connected to the second redistribution layer 212b of the first connection member 210 through an under-bump metallization layer 284 formed on the opening 231 of the encapsulant 230 partially exposing the second redistribution layer 212b of the first connection member 210 and a connection terminal 285 formed on the under-bump metallization layer 284. The memory chip package 287 may include a memory chip such as a volatile memory (for example, a dynamic random access memory (DRAM)), a non-volatile memory (for example, a read only memory (ROM)), a flash memory, or the like.

Since other configurations or a manufacturing method of the fan-out semiconductor package 200E are the same as those described in the fan-out semiconductor package 200A according to another example, descriptions thereof will be omitted.

Figure 33:
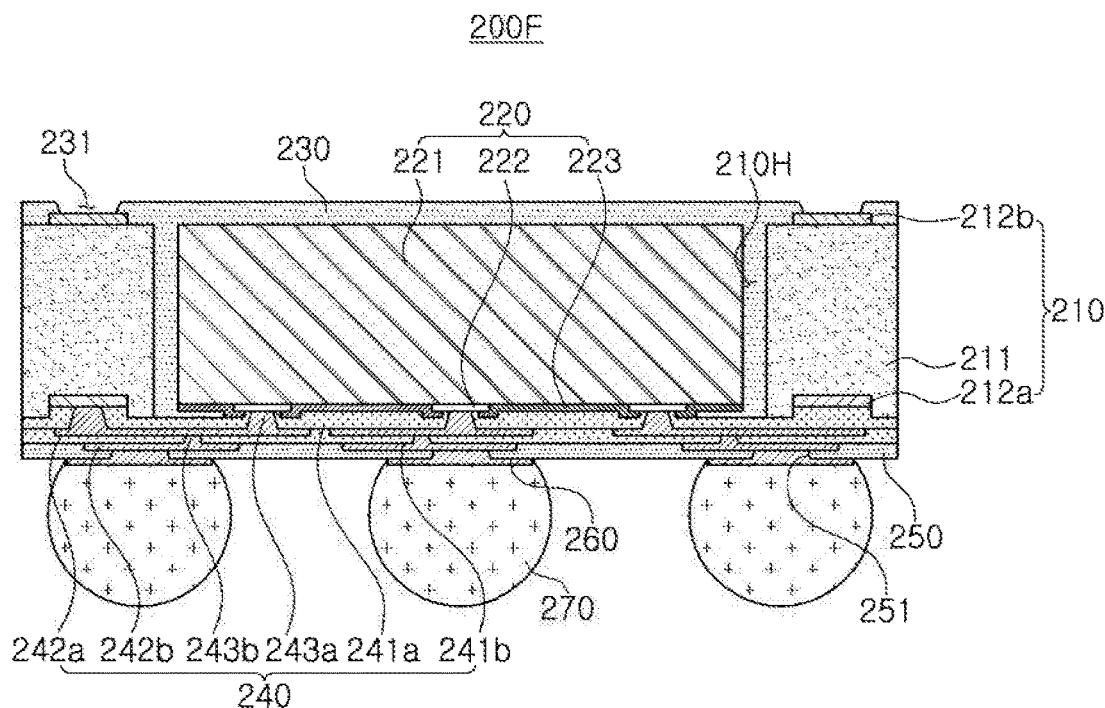
FIG. 33 is a cross-sectional diagram schematically illustrating a modified example of the fan-out semiconductor package of FIG. 23.

FIG. 33 is a cross-sectional diagram schematically illustrating a modified example of the fan-out semiconductor package of FIG. 23.

Referring to FIG. 33, in a fan-out semiconductor package 200F according to the modified example, the first redistribution layer 212a may be recessed in the insulating layer, and thus a step portion may be formed between a lower surface of the insulating layer 211 and a lower surface of the first redistribution layer 212a. As a result, contamination of the first redistribution layer 212a due to bleeding of a material for forming the encapsulant 230 at the time of forming the encapsulant 230 may be prevented. Meanwhile, since the first redistribution layer 212a is recessed in the insulating layer 211 as described above, the lower surface of the first redistribution layer 212a of the first connection member 210 may be positioned to be higher than the lower surface of the connection pad 222 of the semiconductor chip 220. In addition, a distance between the redistribution layer 242a of the second connection member 240 and the first redistribution layer 212a of the first connection member 210 may be greater than a distance between the redistribution layer 242a of the second connection member 240 and the connection pad 222 of the semiconductor chip 220.

Since other configurations or a manufacturing method of the fan-out semiconductor package 200F are the same as those described in the fan-out semiconductor package 200A according to another example, descriptions thereof will be omitted.

FIG. 34 is a cross-sectional diagram schematically illustrating an example of a fan-out semiconductor package in which an insulating distance of a second connection member is non-uniform.

Referring to FIG. 34, similarly, the fan-out semiconductor package in which the insulating distance of the second connection member is non-uniform may include a first connection member 210', a semiconductor chip 220', an encapsulant 230', a second connection member 240', a passivation layer 250' and a connection terminal 270'. The first connection member 210' may have a through hole 210H' and include an insulating layer 211', redistribution layers 212a' and 212b' formed on both surfaces of the insulating layer 211', and a via 213' penetrating through the insulating layer 211'. The semiconductor chip 220' may include a body 221', a connection pad 222', and a passivation film 223'. The second connection member 240' may include insulating layers 241a' and 241b', redistribution layers 242a' and 242b', and vias 243a' and 243b'. The redistribution layer 212a' formed on a lower surface of the first connection member 210' may be embedded in an insulating material of the second connection member 240', such that non-uniformity of the insulating distance may be caused by a step portion H corresponding to a thickness of the redistribution layer 212a'. In addition, since the fan-out semiconductor package does not have a separate under-bump metallization layer, such that board level reliability may be deteriorated.

As set forth above, according to exemplary embodiments in the present disclosure, the fan-out semiconductor package capable of providing a wider routing area while solving the problem of warpage of the fan-out semiconductor package, and having a novel structure facilitating a design of the high-density wiring of the second connection member, and the manufacturing method thereof may be provided.

What is claimed is:

1. A semiconductor package comprising:
a first connection member having a through hole;
a semiconductor chip disposed in the through hole of the first connection member and having an active surface on which a connection pad is disposed and a non-active surface opposing the active surface;
an encapsulant at least partially encapsulating the first connection member and the non-active surface of the semiconductor chip; and
a second connection member,
wherein the first connection member includes a first insulating layer, a first redistribution layer embedded in the first insulating layer on one side thereof, a second redistribution layer disposed on another side of the first insulating layer opposing the one side, and a first via disposed in a first via hole in the first insulating layer and connecting the first and second redistribution layers to each other,
the second connection member includes a second insulating layer on which the first connection member and the semiconductor chip are disposed, a third redistribution layer, and second vias respectively disposed in second via holes,
the second via holes are tapered in a same direction and each penetrate through the second insulating layer,
the second vias connect the connection pad and the third redistribution layer to each other, and the first redistribution layer and the third redistribution layer to each other, respectively,
the first and second redistribution layers are electrically connected to the connection pad,
and
the first via hole extends from the second redistribution layer to the first redistribution layer and is tapered in a direction from the second redistribution layer to the first redistribution layer.

2. The semiconductor package of claim 1, wherein the first connection member further includes a third insulating layer disposed on the first insulating layer and partially embedding the second redistribution layer,
the second redistribution layer includes a lower surface being coplanar with an interface of the first and third insulating layers of the first connection member, an upper surface opposing the lower surface, and side surfaces connecting the upper and lower surfaces to each other, and
the side surfaces and the upper surface of the second redistribution layer are in contact with the third insulating layer of the first connection member.

3. The semiconductor package of claim 2, wherein the first connection member further includes a fourth redistribution layer disposed on and protruding from another side of the third insulating layer opposing one side thereof in which the second redistribution layer is partially embedded, and
the fourth redistribution layer is electrically connected to the connection pad.

4. The semiconductor package of claim 3, wherein the second redistribution layer is electrically connected to the fourth redistribution layer through a third via disposed in a third via hole in the third insulating layer.

5. The semiconductor package of claim 3, wherein the first connection member further includes a fourth insulating layer disposed on the third insulating layer and partially embedding the fourth redistribution layer, and a fifth redistribution layer disposed on and protruding from another side of the fourth insulating layer opposing one side thereof in which the fourth redistribution layer is partially embedded,
the fifth redistribution layer are electrically connected to the connection pad, and
the fourth redistribution layer includes a lower surface being coplanar with an interface of the second and fourth insulating layers of the first connection member, an upper surface opposing the lower surface of the fourth redistribution layer, and side surfaces connecting the upper and lower surfaces of the fourth redistribution layer to each other, and
the side surfaces and the upper surface of the fourth redistribution layer are in contact with the fourth insulating layer of the first connection member.

6. The semiconductor package of claim 1, wherein a distance between the second redistribution layer of the second connection member and the first redistribution layer is greater than a distance between the second redistribution layer of the second connection member and the connection pad.

7. The semiconductor package of claim 1, further comprising:
a passivation layer disposed on the second connection member and having openings exposing portions of a redistribution layer of the second connection member;
under-bump metallization layers disposed in the openings and connected to the exposed portions of the redistribution layer of the second connection member; and
connection terminals disposed on the under-bump metallization layers and electrically connected to the connection pad.

8. The semiconductor package of claim 3,
wherein the fourth redistribution layer includes a lower surface being coplanar with an interface of the third insulating layer of the first connection member and the encapsulant, an upper surface opposing the lower surface of the fourth redistribution layer and including a portion exposed by an opening in the encapsulant, and side surfaces connecting the upper and lower surfaces of the fourth redistribution layer to each other and being in contact with the encapsulant.

9. The semiconductor package of claim 8, further comprising:
a fifth redistribution layer disposed on the encapsulant and electrically connected to the fourth redistribution layer; and
a passivation layer disposed on the encapsulant and having an opening partially exposing the fifth redistribution layer disposed on the encapsulant.

10. The semiconductor package of claim 3, wherein each of the first, third, and fourth redistribution layers includes a ground pattern.

11. The semiconductor package of claim 1, wherein in a stacking direction of the first and second insulating layers, the first redistribution layer is thicker than the second redistribution layer of the second connection member.

12. The semiconductor package of claim 1, wherein a lower surface of the first redistribution layer facing the second connection member is positioned to be higher than a lower surface of the connection pad facing the second connection member, with respect to the second redistribution layer of the second connection member.

13. The semiconductor package of claim 1, wherein the third redistribution layer is positioned between the active surface and the non-active surface of the semiconductor chip.

14. The semiconductor package of claim 1, wherein the encapsulant contains a core material, an inorganic filler, and an insulating resin.

15. The semiconductor package of claim 3, wherein the non-active surface of the semiconductor chip is positioned on a level between an upper surface of the fourth redistribution layer and the first redistribution layer.

16. The semiconductor package of claim 7, wherein one or more of the connection terminals are disposed in a fan-out region.

17. The semiconductor package of claim 1, wherein the first redistribution layer and the second insulating layer are in direct contact with each other at a first interface,
the first insulating layer and the second insulating layer are in direct contact with each other at a second interface, and
the first interface and the second interface have a step.

18. The semiconductor package of claim 1, wherein the first insulating layer is single layer.

19. The semiconductor package of claim 2, wherein in a stacking direction of the first and third insulating layers, a thickness of the first insulating layer is substantially the same as that of the third insulating layer.

20. The semiconductor package of claim 4, wherein the first via hole and the third via hole are tapered in a same direction.

21. The semiconductor package of claim 1, wherein an interface of the first redistribution layer and the second insulating layer is coplanar with an interface of the first insulating layer and the second insulating layer.

22. The semiconductor package of claim 1, wherein the second vias in the second insulating layer and the first via in the first insulating layer are tapered in opposite directions.

23. A semiconductor package comprising:
a semiconductor chip having an active surface on which a connection pad is disposed and a non-active surface opposing the active surface;
a plurality of connection units spaced-apart from each other and disposed around the semiconductor chip;
an encapsulant at least partially encapsulating the plurality of connection units and the non-active surface of the semiconductor chip and filling spaces among the plurality of connection units; and
a connection member,
wherein each connection unit includes a first insulating layer, a first redistribution layer embedded in the first insulating layer on one side thereof, a second redistribution layer disposed on another side of the first insulating layer opposing the one side, and a first via disposed in a first via hole in the first insulating layer and connecting the first and second redistribution layers to each other,
the connection member includes a second insulating layer on which each connection unit and the semiconductor chip are disposed, a third redistribution layer, and second vias respectively disposed in second via holes,
the second via holes are tapered in a same direction and each penetrate through the second insulating layer,
the second vias connect the connection pad and the third redistribution layer to each other, and the first redistribution layer and the third redistribution layer to each other, respectively,
the first and second redistribution layers of the connection unit are electrically connected to the connection pad of the semiconductor chip, and
the first via hole extends from the second redistribution layer to the first redistribution layer and is tapered in a direction from the second redistribution layer to the first redistribution layer.

24. The semiconductor package of claim 23, wherein the encapsulant at least partially covers upper surfaces and side surfaces of the plurality of connection units.

25. The semiconductor package of claim 24, wherein the encapsulant covers all of the side surfaces of the plurality of connection units.

26. The semiconductor package of claim 23, wherein the encapsulant is in contact with the second insulating layer of the connection member.

27. The semiconductor package of claim 23, wherein in a stacking direction of the first and second insulating layers, the first redistribution layer of each connection unit is thicker than the third redistribution layer of the connection member.

28. The semiconductor package of claim 23, wherein each connection unit includes a third insulating layer disposed on the first insulating layer and partially embedding the second redistribution layer, and
in each connection unit, the second redistribution layer includes a lower surface being coplanar with an interface of the first and second insulating layers, an upper surface opposing the lower surface, and side surfaces connecting the upper and lower surfaces to each other, the side surfaces and the upper surface of the second redistribution layer being in contact with the second insulating layer.

29. The semiconductor package of claim 28, wherein each connection unit further includes a fourth redistribution layer disposed on and protruding from another side of the third insulating layer opposing one side thereof in which the second redistribution layer is partially embedded, and
the fourth redistribution layer is electrically connected to the connection pad of the semiconductor chip.

30. The semiconductor package of claim 29,
wherein the fourth redistribution layer includes a lower surface being coplanar with an interface of the third insulating layer and the encapsulant, an upper surface opposing the lower surface of the fourth redistribution layer and including a portion exposed by an opening in the encapsulant, and side surfaces connecting the upper and lower surfaces of the fourth redistribution layer to each other and being in contact with the encapsulant.

31. The semiconductor package of claim 23, wherein the first redistribution layer of each connection unit and the second insulating layer of the connection member are in direct contact with each other at a first interface, the first insulating layer of each connection unit and the second insulating layer of the connection member are in direct contact with each other at a second interface, and the first interface and the second interface have a step.

32. The semiconductor package of claim 23, wherein in each connection unit, the first insulating layer is single layer.

33. The semiconductor package of claim 28, wherein in a stacking direction of the first and third insulating layers in each connection unit, a thickness of the first insulating layer is substantially the same as that of the third insulating layer.

34. The semiconductor package of claim 23, wherein in each connection unit, an interface of the first redistribution layer and the second insulating layer is coplanar with an interface of the first insulating layer and the second insulating layer.

35. The semiconductor package of claim 23, wherein the second vias in the second insulating layer and the first via in the first insulating layer are tapered in opposite directions.

36. A semiconductor package comprising:
a first connection member having a through hole;
a semiconductor chip disposed in the through hole of the first connection member and having an active surface on which a connection pad is disposed and a non-active surface opposing the active surface;
an encapsulant at least partially encapsulating the first connection member and the non-active surface of the semiconductor chip; and
a second connection member,
wherein the first connection member includes a first insulating layer, a first redistribution layer embedded in the first insulating layer on one side thereof, a second redistribution layer disposed on and protruding from another side of the first insulating layer opposing the one side, and a first via connecting the first and second redistribution layers to each other and disposed in a first via hole in the first insulating layer,
the first and second redistribution layers are electrically connected to the connection pad,
the second redistribution layer includes a lower surface being coplanar with an interface between the first insulating layer of the first connection member and the encapsulant, an upper surface opposing the lower surface of the second redistribution layer and including a portion exposed by an opening in the encapsulant, and side surfaces connecting the upper and lower surfaces of the second redistribution layer to each other and being in contact with the encapsulant,
the second connection member includes a second insulating layer on which the first connection member and the semiconductor chip are disposed, a third redistribution layer, and second vias respectively disposed in second via holes,
the second via holes are tapered in a same direction and each penetrate through the second insulating layer,
the second vias connect the connection pad and the third redistribution layer to each other, and the first redistribution layer and the third redistribution layer to each other, respectively, and
the first via hole extends from the second redistribution layer to the first redistribution layer and is tapered in a direction from the second redistribution layer to the first redistribution layer.

* * * * *